(12) United States Patent
Kikuchi et al.

(10) Patent No.: US 11,805,708 B2
(45) Date of Patent: Oct. 31, 2023

(54) QUANTUM DEVICE

(71) Applicant: NEC Corporation, Tokyo (JP)

(72) Inventors: Katsumi Kikuchi, Tokyo (JP); Akira Miyata, Tokyo (JP); Suguru Watanabe, Tokyo (JP); Takanori Nishi, Tokyo (JP); Hideyuki Satou, Tokyo (JP); Kenji Nanba, Tokyo (JP); Ayami Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 179 days.

(21) Appl. No.: 17/347,820

(22) Filed: Jun. 15, 2021

(65) Prior Publication Data

US 2021/0399197 A1    Dec. 23, 2021

(30) Foreign Application Priority Data

Jun. 19, 2020    (JP) ................. 2020-106147

(51) Int. Cl.
    *H10N 60/12*    (2023.01)
    *G06N 10/00*    (2022.01)
    *H10N 60/80*    (2023.01)
    *H10N 69/00*    (2023.01)

(52) U.S. Cl.
    CPC .......... *H10N 60/124* (2023.02); *G06N 10/00* (2019.01); *H10N 60/805* (2023.02); *H10N 69/00* (2023.02)

(58) Field of Classification Search
    CPC ... H10N 69/00; H01L 23/147; H01L 23/3677; H01L 23/49811; H01L 23/49888
    See application file for complete search history.

(56) References Cited

U.S. PATENT DOCUMENTS

|  |  |  |  |  |
|---|---|---|---|---|
| 9,836,699 B1 | * | 12/2017 | Rigetti | ................... G06N 10/00 |
| 11,152,707 B1 | * | 10/2021 | Janett | ..................... H01Q 13/18 |
| 2020/0152540 A1 | * | 5/2020 | Nah | ........................ H01L 24/08 |

FOREIGN PATENT DOCUMENTS

WO    2018/212041 A1    11/2018

* cited by examiner

*Primary Examiner* — Matthew L Reames
(74) *Attorney, Agent, or Firm* — Sughrue Mion, PLLC

(57)    ABSTRACT

A quantum device according to an example embodiment includes a quantum chip 10, and an interposer 20 on which the quantum chip 10 is mounted, in which the interposer 20 includes a conductive wiring line CL1 electrically connected to the quantum chip 10, a mounting surface 21 of the interposer 20 on which the quantum chip 10 is mounted or an opposite surface 22 opposite to the mounting surface 21 includes a first area AR11 and a second area AR12 different from the first area AR11 as viewed in a direction perpendicular to the mounting surface 21 or the opposite surface 22, the conductive wiring line CL1 is disposed in the first area AR11 on the mounting surface 21 or the opposite surface 22, and a movable member 60 is in contact with the second area AR12 of the interposer 20.

20 Claims, 18 Drawing Sheets

US 11,805,708 B2

QUANTUM DEVICE

INCORPORATION BY REFERENCE

This application is based upon and claims the benefit of priority from Japanese patent application No. 2020-106147, filed on Jun. 19, 2020, the disclosure of which is incorporated herein in its entirety by reference.

TECHNICAL FIELD

The present disclosure relates to a quantum device.

BACKGROUND ART

International Patent Publication No. WO2018/212041 discloses a quantum device in which a quantum chip which uses its quantum state is mounted on an interposer by using a flip-chip mounting technique. In order to use such a quantum device in a superconducting state, it is conceivable to fix the surface of the interposer on which the quantum chip is not mounted (i.e., the surface of the quantum chip opposite to the surface thereof on which the quantum chip is mounted) onto a sample stage having a cooling function. In such a case, the quantum chip is cooled by heat conduction with the sample stage through the interposer, and its temperature is maintained at a predetermined temperature.

In the above-described quantum device, since one of the surfaces of the interposer is used for the cooling by the heat conduction with the sample stage, the number of terminals that can be led (i.e., wired) to the outside is limited. Meanwhile, the quantum chip cannot exhibit sufficient performance unless it is cooled to a predetermined temperature, so it is necessary to increase the number of terminals while cooling the quantum chip to the predetermined temperature.

SUMMARY

The present disclosure has been made to solve above-described problem, and an object thereof is to provide a quantum device capable of improving a cooling function while securing the number of terminals.

In a first example aspect, a quantum device includes: a quantum chip in which a quantum bit is formed; and an interposer on which the quantum chip is mounted, in which the interposer includes a conductive wiring line electrically connected to the quantum chip, a mounting surface of the interposer on which the quantum chip is mounted or an opposite surface opposite to the mounting surface includes a first area and a second area different from the first area as viewed in a direction perpendicular to the mounting surface or the opposite surface, the conductive wiring line is disposed in the first area on the mounting surface or the opposite surface, and a movable member is in contact with the second area of the interposer, the movable member including a movable pin movable relative to a sample stage having a cooling function so as to protrude from the sample stage.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENTS

Figure 1:
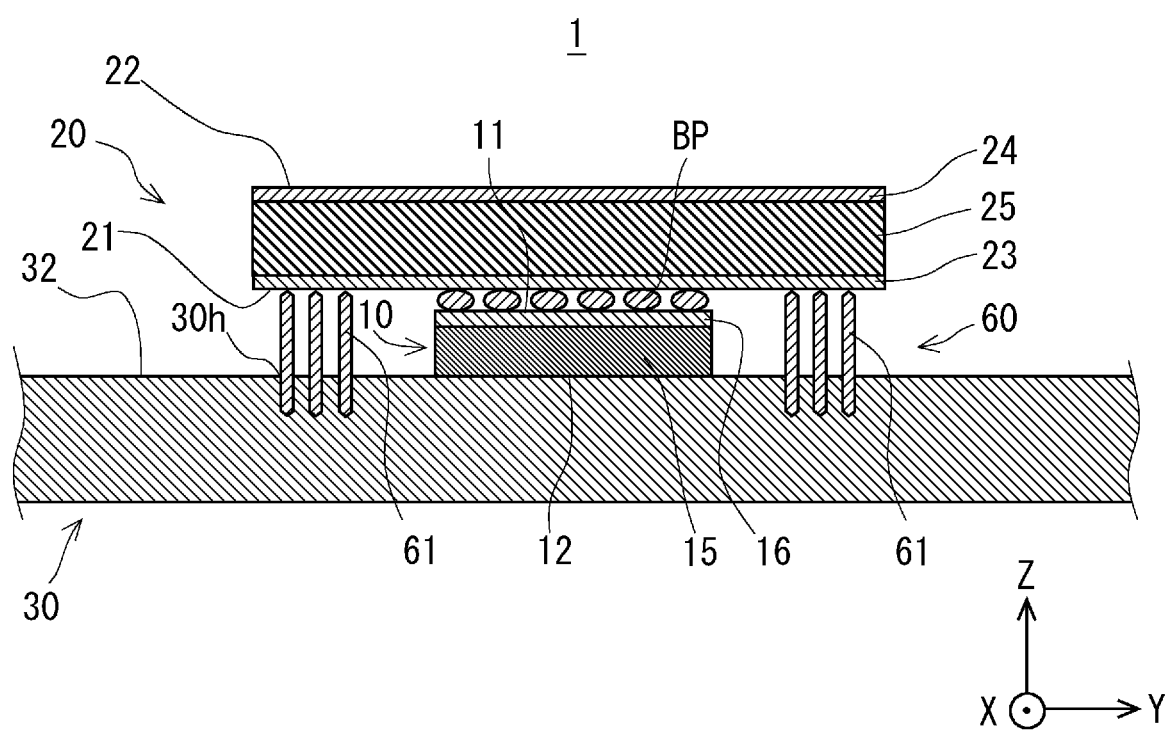
FIG. 1 is a cross-sectional view showing an example of a quantum device according to a first example embodiment.

Quantum computing is a technical field in which data is manipulated by using a quantum mechanical phenomenon (a quantum bit). The quantum mechanical phenomenon is, for example, superposition of a plurality of states (i.e., a quantum variable simultaneously assumes a plurality of different states) or entanglement (i.e., a state in which a plurality of quantum variables are related to each other in terms of space or time). In a quantum chip, a quantum circuit that generates a quantum bit is provided. The following description and the drawings are partially omitted and simplified as appropriate for clarifying the explanation. Further, the same elements are denoted by the same reference numerals (or symbols) throughout the drawings, and redundant descriptions thereof are omitted as appropriate.

First Example Embodiment

Figure 2:
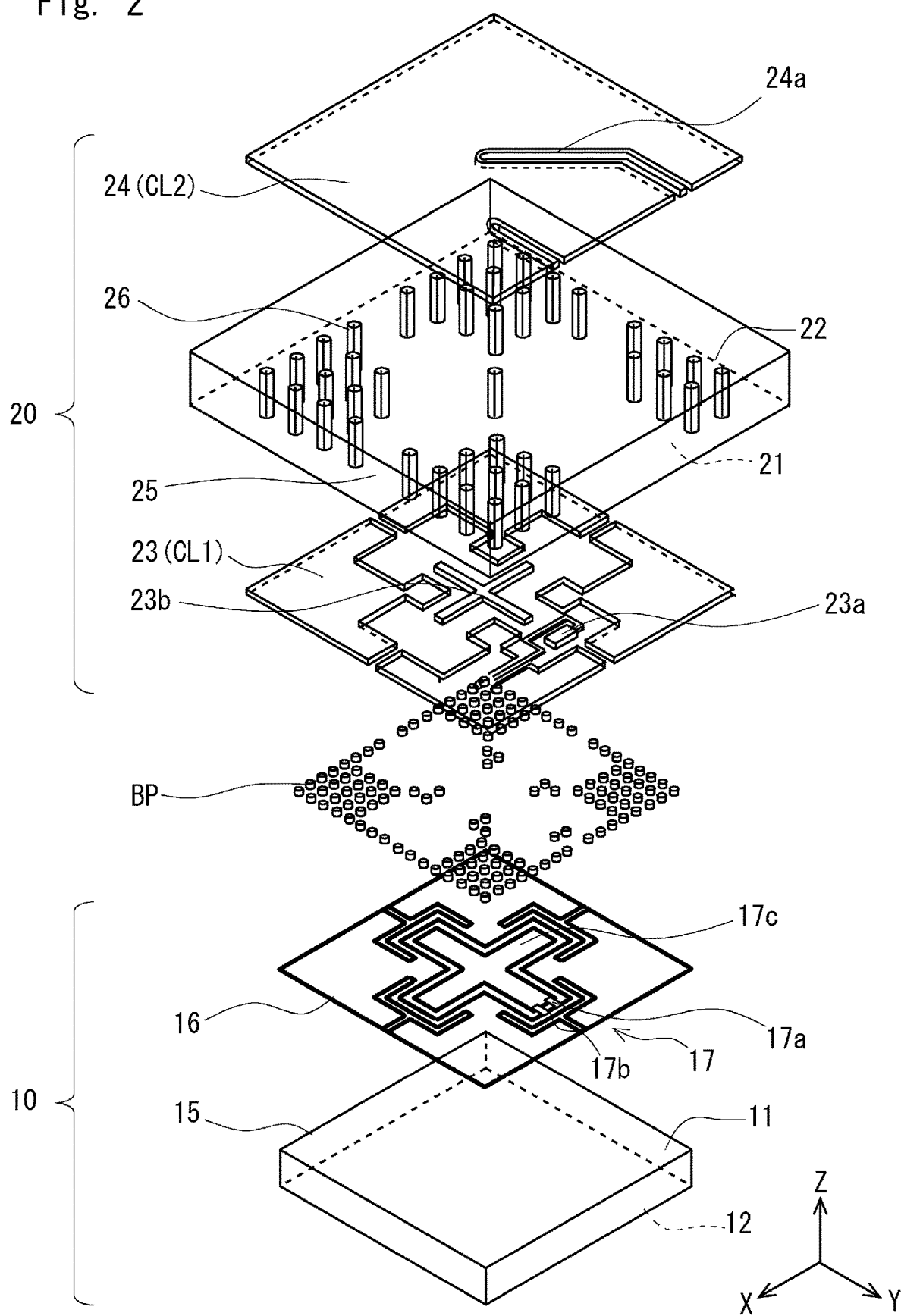
FIG. 2 is an exploded perspective view showing an example of a quantum chip and an interposer in the quantum device according to the first example embodiment.

A quantum device according to a first example embodiment will be described. FIG. 1 is a cross-sectional view showing an example of a quantum device according to the first example embodiment. FIG. 2 is an exploded perspective view showing an example of a quantum chip and an interposer in the quantum device according to the first example embodiment. As shown in FIGS. 1 and 2, the quantum device 1 includes a quantum chip 10 and an interposer 20.

The quantum chip 10 includes a chip substrate 15 and a wiring layer 16. The chip substrate 15 contains, for example, silicon (Si). Note that the chip substrate 15 is not limited to those containing silicon and may include those containing other electronic materials such as sapphire or a compound semiconductor material (Groups IV, III-V, and II-VI) as long as the quantum chip 10 can form a quantum bit. Further, the material is preferably a single-crystalline material, but it may be a polycrystalline material or an amorphous material.

The chip substrate 15 has, for example, a plate-like shape, and has one plate surface and the other plate surface opposite to the one plate surface. The one plate surface is called a first surface 11, and the other plate surface is called a second surface 12. Therefore, the quantum chip 10 and the chip substrate 15 have the first surface 11 and the second surface 12. For example, both the first and second surfaces 11 and 12 have a rectangular shape. In the quantum device 1, the first surface 11 faces the interposer 20 side. The quantum chip 10 is mounted on the interposer 20 so that the first surface 11 is opposed to the interposer 20 with bumps BP interposed therebetween. The second surface 12 is in contact with, for example, a predetermined surface 32 of a sample stage 30. The predetermined surface 32 is, for example, the upper surface of the sample stage 30.

The wiring layer 16 is disposed on the first surface 11 side of the chip substrate 15. The wiring layer 16 contains, for example, a superconducting material such as niobium (Nb). Note that the superconducting material used in the wiring layer 16 is not limited to niobium (Nb). For example, the superconducting material may contain niobium nitride, aluminum (Al), indium (In), lead (Pb), tin (Sn), rhenium (Re), palladium (Pd), titanium (Ti), or an alloy containing at least one of them.

The wiring layer 16 includes a quantum circuit 17. A resonator 17c including a loop circuit 17b in which pieces of a superconducting material are connected to each other in a circular manner by Josephson junctions 17a is formed in the quantum circuit 17. The material used for the Josephson junctions is preferably aluminum (Al), but may be other superconducting materials. The quantum circuit 17 performs a process using the resonator 17c in a superconducting state in which the quantum chip is in a quantum state. As described above, the quantum chip 10 includes the quantum circuit 17 and performs a process under a quantum state.

The wiring layer 16 is mounted (e.g., formed) on the interposer 20 with the bumps BP interposed therebetween. Therefore, the quantum chip 10 is mounted on the interposer 20 by using a flip-chip mounting technique.

The bumps BP may contain the above-described superconducting material. The bumps BP may contain the same superconducting material as that contained in the wiring layer 16, and/or a superconducting material different from that contained in the wiring layer 16. Further, when the bump BP includes a plurality of metal layers, at least one of the layers preferably includes a superconducting material. The bump BP may have a layered structure including Nb (the wiring surface of the quantum chip 10)/In (Sn, Pb, or an alloy containing at least one of them)/Ti/Nb (the wiring surface of the interposer 20)/Cu, or a layered structure including Nb (the wiring surface of the quantum chip 10)/Nb (the wiring surface of the interposer 20)/Cu. Alternatively, the bump BP may have a layered structure including Nb (the wiring surface of the quantum chip 10)/In (Sn, Pb, or an alloy containing at least one of them)/Ta (the wiring surface of the interposer 20)/Cu. Further, in the case where the bump BP contains Al and In, TiN may be used for a barrier layer in order to prevent Al and In from forming an alloy thereof. In such a case, the bump BP may have a layered structure including Al (the wiring surface of the quantum chip 10)/Ti/TiN/In (Sn, Pb, or an alloy containing at least one of them)/TiN/Ti/Al (the wiring surface of the interposer 20)/Cu. Note that Ti is an adhesion layer. The flip-chip connection is preferably Nb (the wiring of the quantum chip 10)/In/Ti/Nb (the wiring surface of the interposer 20)/Cu, or Nb (the wiring of the quantum chip 10)/Nb (wiring surface of the interposer 20)/Cu. Copper (Cu) is preferably added to an interposer wiring layer 23 having a thickness of 2 μm in a range of thickness from 2 μm to 10 μm, and bumps each of which has a diameter of 100 μm are preferably provided.

The interposer 20 includes interposer wiring layers 23 and 24, an interposer substrate 25, and through vias (hereafter referred to as TVs 26) (in this specification, the term "through via" also means a conductive material with which the through via is filled). Note that, in FIG. 1, illustration of the TVs 26 is omitted in order to prevent the drawing from becoming too complicated.

The interposer substrate 25 is, for example, a plate-like substrate. The interposer substrate 25 contains, for example, silicon (Si). Note that the interposer substrate 25 is not limited to those containing silicon and may include those containing other electronic materials such as sapphire or a compound semiconductor material (Groups IV, III-V, and II-VI) as long as the quantum chip 10 can mounted thereon. The surface of the interposer substrate 25 is preferably covered by a silicon oxide film (such as a $SiO_2$ film or a TEOS film). The interposer substrate 25 and the interposer 20 have a mounting surface 21 on which the quantum chip 10 is mounted, and an opposite surface 22 opposite to the mounting surface 21.

Note that an XYZ-orthogonal coordinate system is used for facilitating the explanation of the quantum device 1. A plane parallel to the opposite surface 22 of the interposer 20 is defined as an XY-plane, and a direction perpendicular to the opposite surface 22 is defined as a Z-axis direction. The Z-axis positive direction is referred to as an upward direction and the Z-axis negative direction is referred to as a downward direction. Note that the terms "upward" and "downward" are used just for the explanatory purpose, and do not indicate the directions in which the actual quantum device 1 is positioned when it is used.

For example, the quantum chip 10 is disposed on the Z-axis negative direction side of the interposer 20. The wiring layer 16 disposed on the X-axis positive direction side of the quantum chip 10 and the mounting surface 21 disposed on the Z-axis negative direction side of the interposer 20 are connected to each other through the bumps BP.

The interposer wiring layer 23 is formed on the mounting surface 21 side of the interposer 20, i.e., on the Z-axis negative direction side of the interposer 20. The interposer wiring layer 23 includes the above-described superconducting material. The interposer wiring layer 23 may contain the same superconducting material as that contained in the wiring layer 16, and/or a superconducting material different from that contained in the wiring layer 16. For example, the interposer wiring layer 23 preferably contains, as viewed from the surface toward the interposer substrate 25, Nb (having a thickness of 0.1 μm), Cu (having a thickness of 2 μm), and Ti in this order. For example, in the case where the interposer substrate 25 contains silicon, the mounting surface 21 side of the interposer 20 preferably has a structure expressed as Nb/Cu/Ti/SiO$_2$/Si (the interposer substrate 25).

The interposer wiring layer 23 includes a conductive wiring line CL1. The conductive wiring line CL1 is electrically connected to the quantum chip 10. That is, the conductive wiring line CL1 is electrically connected to the wiring layer 16 of the quantum chip 10 through the bumps BP. Therefore, the conductive wiring line CL1 is a wiring line that contributes to the quantum chip 10. The interposer wiring layer 23 may include a wiring line(s) other than the conductive wiring line CL1. The wiring line other than the conductive wiring line CL1 is not electrically connected to the quantum chip 10. The wiring line other than conductive wiring line CL1 may include, for example, a wiring line(s) and a circuit(s) that are used to discharge heat from the interposer 20, and may include, for example, TVs 26 which are not electrically connected to the quantum chip 10. Therefore, the lines other than the conductive wiring line CL1 do not contribute to the quantum chip 10.

The interposer wiring layer 23 may be a single layer or composed of a plurality of layers. The interposer wiring layer 23 may include a magnetic-field applying circuit 23a and a reading part 23b. The magnetic-field applying circuit 23a generates a magnetic field applied to the loop circuit 17b. It is possible to make the quantum circuit 17 function as a transmitter by applying a magnetic field to the loop circuit 17b. The reading part 23b reads information from the quantum circuit 17.

The interposer wiring layer 24 is formed on the opposite surface 22 side of the interposer substrate 25, i.e., on the Z-axis positive direction side of the interposer 20. The interposer wiring layer 24 may contain the above-mentioned superconducting material. The interposer wiring layer 24 may contain the same superconducting material as those contained in the wiring layer 16 and the interposer wiring layer 23, and/or a superconducting material different from those contained in the wiring layer 16 and the interposer wiring layer 23. Further, the interposer wiring layer 24 may contain a normal conductive material. The normal conductive material is, for example, copper (Cu), silver (Ag), gold (Au), platinum (Pt), or an alloy containing at least one of them. For example, the interposer wiring layer 24 preferably contains, as viewed from the surface toward the interposer substrate 25, Cu and Ti in this order. For example, in the case where the interposer substrate 25 contains silicon, the opposite surface 22 side of the interposer 20 preferably has a structure expressed as Cu/Ti/SiO$_2$/Si (the interposer substrate 25).

The interposer wiring layer 24 includes a conductive wiring line CL2. The conductive wiring line CL2 is electrically connected to the quantum chip 10. That is, the conductive wiring line CL2 is connected to the wiring layer 16 of the quantum chip 10 through the TVs 26 and the bumps BP. Further, the conductive wiring line CL2 may be electrically connected to the wiring layer 16 of the quantum chip 10 through the TVs 26, the conductive wiring line CL1, and the bumps BP. Therefore, the conductive wiring line CL2 is a line that contributes to the quantum chip 10. The interposer wiring layer 24 may include a wiring line(s) other than the conductive wiring line CL2. The wiring line other than the conductive wiring line CL2 is not electrically connected to the quantum chip 10. The wiring line other than the conductive wiring line CL2 may include, for example, a wiring line(s) and a circuit(s) that are used to discharge heat from the interposer 20, and may include, for example, TVs 26 which are not electrically connected to the quantum chip 10. Therefore, the wiring lines other than the conductive wiring line CL2 do not contribute to the quantum chip 10.

The interposer wiring layer 24 may be a single layer or composed of a plurality of layers. The interposer wiring layer 24 includes a terminal 24a through which information is acquired from the quantum chip 10 through the TVs 26 (i.e., through the conductive materials with which the TVs 26 are filled). Although only one terminal 24a is shown in FIG. 2, a plurality of terminals 24a may be formed in the interposer wiring layer 24. In the quantum device 1 according to this example embodiment, it is possible to make full use of the opposite surface 22 for the terminal(s) 24a through which information is acquired.

The TVs 26 extends from the mounting surface 21 side of the interposer substrate 25 to the opposite surface 22 side thereof. The interposer wiring layers 23 and 24 may be connected to each other through the TVs 26. Further, the TVs 26 may be connected to a wiring line(s) and a circuit(s) that are used to discharge heat from the interposer 20.

The TVs 26 (i.e., the conductive materials with which the TVs 26 are filled) may contain the superconducting material described above. The TVs 26 may contain the same superconducting material as that contained in the wiring layer 16 and the like, and/or a superconducting material different from that contained in the wiring layer 16 and the like. Further, the TVs 26 may contain the above-described normal conductive material. The TVs 26 may contain the same normal conductive material as that contained in the interposer wiring layer 24, and/or a normal conductive material different from that contained in the interposer wiring layer 24. For example, each of the TVs 26 may be formed by forming SiO$_2$ (e.g., a thermal oxide film) on the side wall of a through hole having a diameter of 50 μm and filling the through hole with Cu while using Ti as an adhesion layer.

Figure 3:
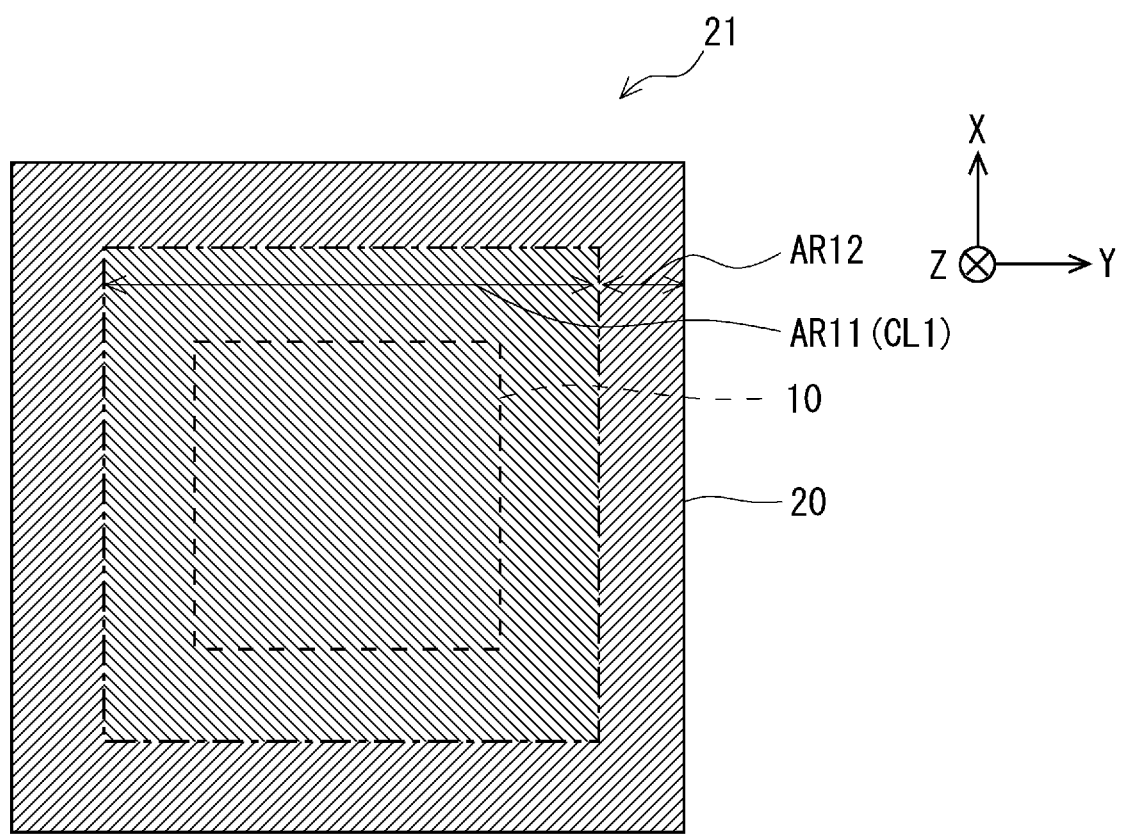
FIG. 3 is a plan view showing an example of a mounting surface of the interposer according to the first example embodiment.

FIG. 3 is a plan view showing an example of the mounting surface 21 of the interposer 20 according to the first example embodiment. As shown in FIG. 3, the quantum chip 10 is mounted on the mounting surface 21. The mounting surface 21 of the interposer 20 on which the quantum chip is mounted includes a first area AR11 and a second area AR12 different from the first area AR11 as viewed in a direction perpendicular to the mounting surface 21. The conductive wiring line CL1 is disposed in the first area AR11 on the mounting surface 21. In other words, on the mounting surface 21, the area where the conductive wiring line CL1 is disposed is defined as the first area AR11 and the area where the conductive wiring line CL1 is not disposed is defined as the second area AR12. The first area AR11 is located, for example, in the central part of the mounting surface 21. The second area AR12 is located, for example, on the periphery of the mounting surface 21. Note that the positions of the first and second areas AR11 and AR12 on the mounting surface 21 are not limited to the aforementioned positions. Depending on the position where the conductive wiring line CL1 is disposed, the first area AR11 may be located in a predetermined area such as on the peripheral or on the X-axis positive direction side, and the second area AR12 may be located in a predetermined area such as in the central part or on the X-axis negative direction side. For example, the first area AR11 may be divided into a plurality of areas, and/or the second area AR12 may be divided into a plurality of areas.

Figure 4:
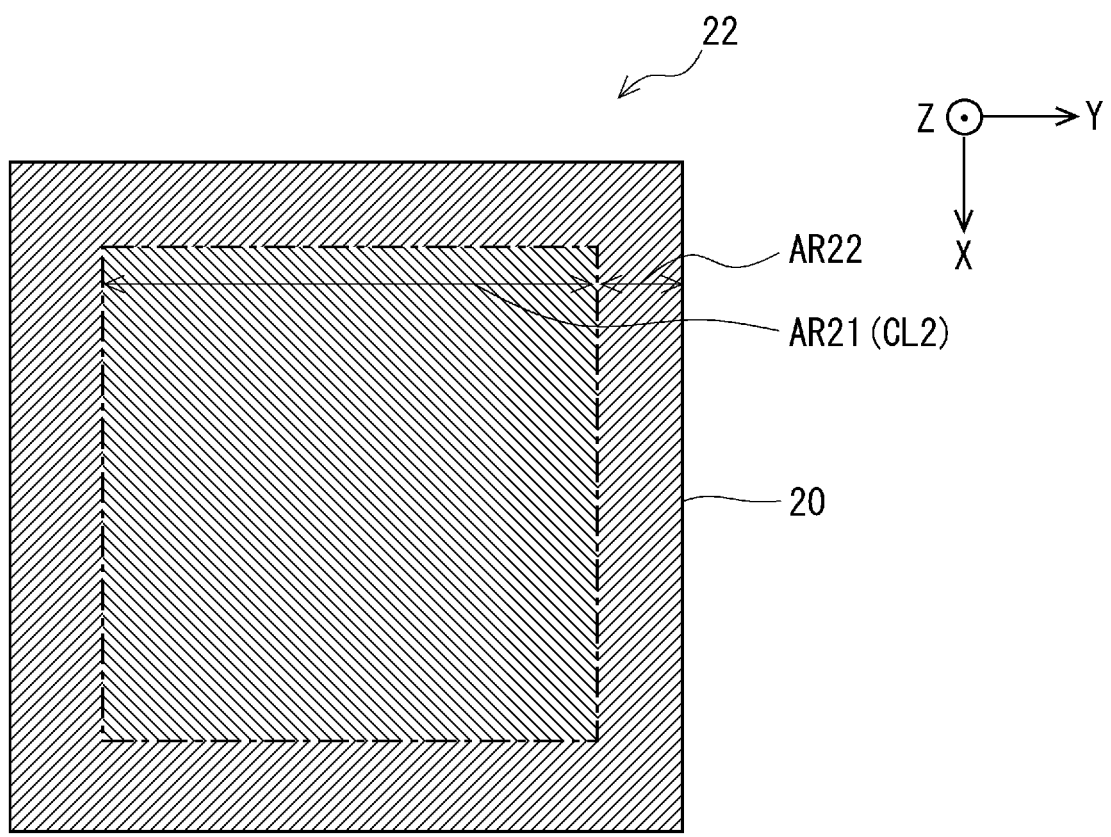
FIG. 4 is a plan view showing an example of an opposite surface of the interposer according to the first example embodiment.

FIG. 4 is a plan view showing an example of the opposite surface 22 of the interposer 20 according to the first example embodiment. As shown in FIG. 4, the opposite surface 22 has a first area AR21 and a second area AR22 different from the first area AR21 as viewed in the direction perpendicular to the opposite surface 22. The conductive wiring line CL2 is disposed in the first area AR21 of the opposite surface 22. In other words, on the opposite surface 22, the area where the conductive wiring line CL2 is disposed is defined as the first area AR21 and the area where the conductive wiring line CL2 is not disposed is defined as the second area AR22. The first area AR21 is located, for example, in the central part of the opposite surface 22. The second area AR22 is located, for example, on the periphery of the opposite surface 22. Note that the positions of the first and second areas AR21 and AR22 on the opposite surface 22 are not limited to the aforementioned positions. Depending on the position where the conductive wiring line CL2 is disposed, the first area AR21 may be located in a predetermined area such as on the peripheral or on the X-axis positive direction side, and the second area AR22 may be located in a predetermined area such as in the central part or on the X-axis negative direction side. For example, the first area AR21 may be divided into a plurality of areas, and/or the second area AR22 may be divided into a plurality of areas.

As shown in FIG. 1, the sample stage 30 has a cooling function. For example, the sample stage 30 is a cold stage that can be cooled to an extremely low temperature of about 10 [mK] by a refrigerator. The sample stage 30 preferably contains a metal such as Cu, a Cu alloy, or Al. In the case where the sample stage 30 contains Al, it may be insulated by carrying out an alumite treatment. In the quantum device 1 according to this example embodiment, for example, a superconducting phenomenon at an extremely low temperature of 9.2 [K] or lower is used when the quantum device 1 contains Nb as the superconducting material of the quantum chip 10, and a superconducting phenomenon at an extremely low temperature of 1.2 [K] or lower is used when the quantum device 1 contains Al as the superconducting material of the quantum chip 10. Therefore, the sample stage 30 that can be cooled to such an extremely low temperature is used.

A movable member 60 is provided in the sample stage 30. The movable member 60 includes movable pins 61. The movable member 60 may include one movable pin 61 or a plurality of movable pins 61. In the drawing, some reference numerals (or symbols) are omitted in order to prevent the drawing from becoming too complicated. Each of the movable pins 61 is, for example, a narrow pin-like member extending in the longitudinal direction, and includes one end and the other end. The other end of the movable pin 61 may be provided with, for example, an elastic member such as a coil spring or a leaf spring. For example, holes 30h are formed in a predetermined surface 32 of the sample stage 30 such as the upper surface thereof. Further, the other ends of the movable pins 61 are inserted into the holes 30h formed in the sample stage 30. In this way, the one ends of the movable pins 61 protrude from the upper surface of the sample stage 30. By the above-described configuration, the movable pins 61 are movable relative to the sample stage 30 so as to protrude from the sample stage 30.

The movable member 60 including the movable pins 61 is in contact with the interposer 20. In the quantum device 1 according to this example embodiment, the mounting surface 21 of the interposer 20 is opposed to the sample stage 30. For example, the movable member 61 including the movable pins 60 is in contact with the second area AR12 of the mounting surface 21 of the interposer 20. It is possible to prevent or reduce occurrences of electrical short circuits with the conductive wiring line CL1 by keeping the movable member 60 in contact with the second area AR12. In the second area AR12, the movable pins 61 may be in contact with the wiring line and the circuit used for the discharge of heat from the interposer 20, or with the TVs 26 used for the discharge of heat.

The movable pins 61 may be in contact with the first area AR11 of the mounting surface 21 of the interposer 20 as long as occurrences of electrical short circuits with the conductive wiring line CL1 are prevented. It is possible to improve the discharge of heat by keeping the movable member 60 in contact with the first area AR11, and thereby to improve the cooling performance of the quantum device 1.

The movable pins 61 preferably contain a material having high thermal conductivity. The movable pins 61 may contain the same material as that contained in the sample stage 30, and/or may contain the above-described superconducting material. The movable pins 61 may contain the same superconducting material as that contained in the wiring layer 16 and the like, and/or a superconducting material different from that contained in the wiring layer 16 and the like. Further, the movable pins 61 may contain the above-described normal conductive material. The movable pins 61 may contain the same normal conductive material as that contained in the interposer wiring layer 24 and the like, and/or a normal conductive material different from that contained in the interposer wiring layer 24 and the like. Further, the movable pins 61 may contain ceramic having high thermal conductivity such as aluminum nitride. In the case of movable pins 61 containing a conductive material, when it is necessary to prevent occurrences of electrical short circuits between the movable pins 61 and other members, the movable pins 61 may be covered with an insulating film.

Alternatively, the movable pins 61 may be kept in an electrically conductive state and a constant potential may be applied thereto. For example, a ground potential may be applied to the movable pins 61, or the same potential as that of the sample stage 30 may be applied thereto. In this way, the wiring line and the circuit in the interposer 20 that are not electrically connected to the quantum chip 10 can obtain a constant potential such as the ground potential from the movable pins 61. Note that, in such a case, the movable pins 61 preferably contain an electrically conductive material having high thermal conductivity.

Next, advantageous effects of this example embodiment will be described. In the quantum device 1 according to this example embodiment, the interposer 20 is in contact with the movable pins 61. It is possible to cool the quantum circuit 17 of the quantum chip 10 to an extremely low temperature by using the movable pins 61 and the interposer 20 as a heat flow path from the sample stage 30, and thereby to use a superconducting phenomenon.

Since the movable pins 61 are movable, they follow (i.e., conform to) the changes in volumes (hereinafter also referred to as the volume changes) of the quantum chip 10 and the interposer 20 which occur when the quantum device 1 is cooled to an extremely low temperature, so it is possible to prevent the disconnection (e.g., the break) of the heat flow path and, in some cases, to prevent the disconnection (e.g., the break) of electrical wires. As described above, the other ends of the movable pins 61 are inserted into the holes 30h formed in the sample stage 30 with elastic means such as a coil spring and a leaf spring interposed therebetween, so that the movable pins 61 are disposed in a pressed state between the interposer 20 and the sample stage 30. Therefore, the movable pins 61 are in a state in which they are pressed by the interposer 20 and the sample stage 30 through the elastic means. Owing to this pressed state, the movable pins 61 can move in response to the volume changes resulting from contraction and the like caused by the cooling, and therefore can maintain the heat flow path. Further, in the case where the movable pins 61 are used in a conductive state, it is possible to effectively prevent the disconnection (e.g., break) of wires.

The movable pins 61 are in contact with the second area AR12 of the mounting surface 21 where the conductive wiring line CL1 is not disposed. Therefore, it is possible to prevent or reduce occurrences of electrical short circuits with the conductive wiring line CL1.

It is possible to improve the cooling performance of the quantum device 1 even further by bringing the second surface 12 of the quantum chip 10 into contact with the sample stage 30.

(First Modified Example)

Figure 5:
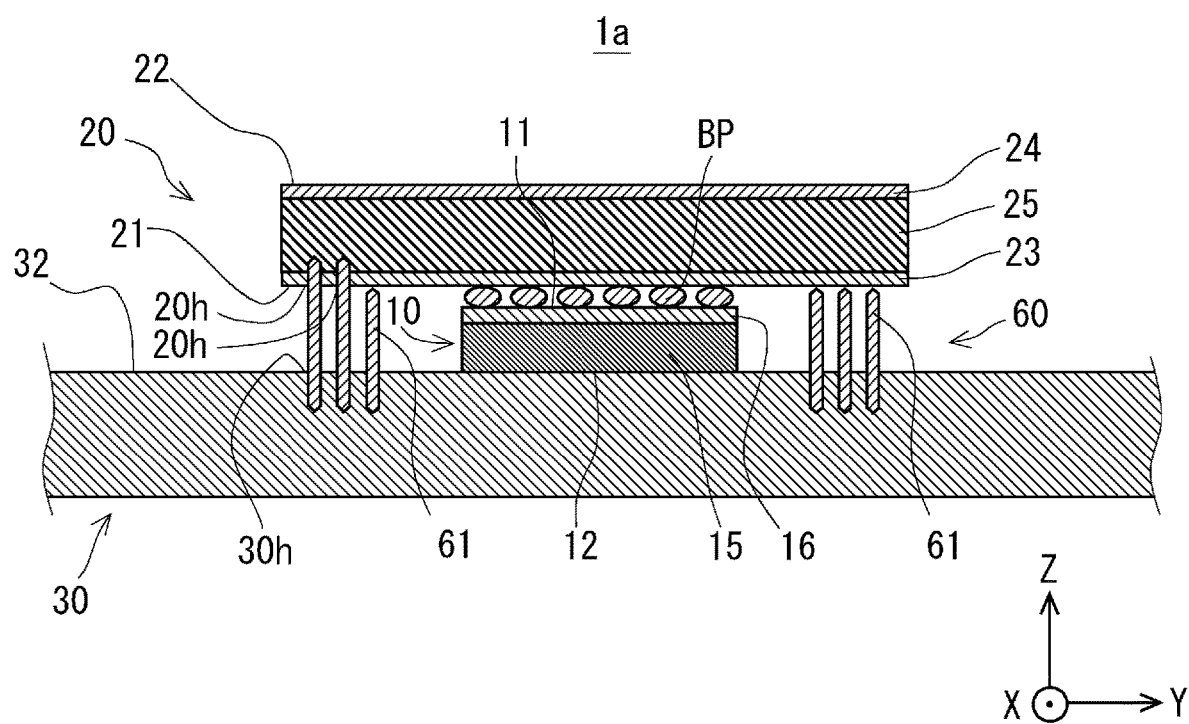
FIG. 5 is a cross-sectional view showing an example of holes formed in an interposer and movable pins according to a first modified example of the first example embodiment.

Next, a first modified example of the first example embodiment will be described. In this modified example, movable pins 61 are inserted into holes formed in the interposer 20. FIG. 5 is a cross-sectional view showing an example of holes formed in the interposer and movable pins 61 according to the first modified example of the first example embodiment. As shown in FIG. 5, in a quantum device 1a, the interposer 20 has holes 20h formed in the second area AR12 of the mounting surface 21. The movable pins 61 are inserted into the holes 20h. Further, the movable pins 61 are in contact with the inner surfaces of the holes 20h. In the case where the movable member 60 includes a plurality of movable pins 61, all the movable pins 61 may be inserted into respective holes 20h the number of which is equal to the number of the movable pins 61. Alternatively, only one of or some of the movable pins 61 may be inserted into one or some holes 20h.

By the above-described configuration, the movable pins 61 are in contact with the interposer 20, in particular, in contact with the inner surfaces of the holes 20h formed in the interposer 20, so that it is possible to secure a heat flow path extending from the sample stage 30 to the interposer 20 and the quantum chip 10 through the movable pins 61. Further, since the positions of the movable pins 61 on the XY-plane are confined within the insides of the holes 20h, it is possible to position the interposer 20 at a determined place.

(Second Modified Example)

Figure 6:
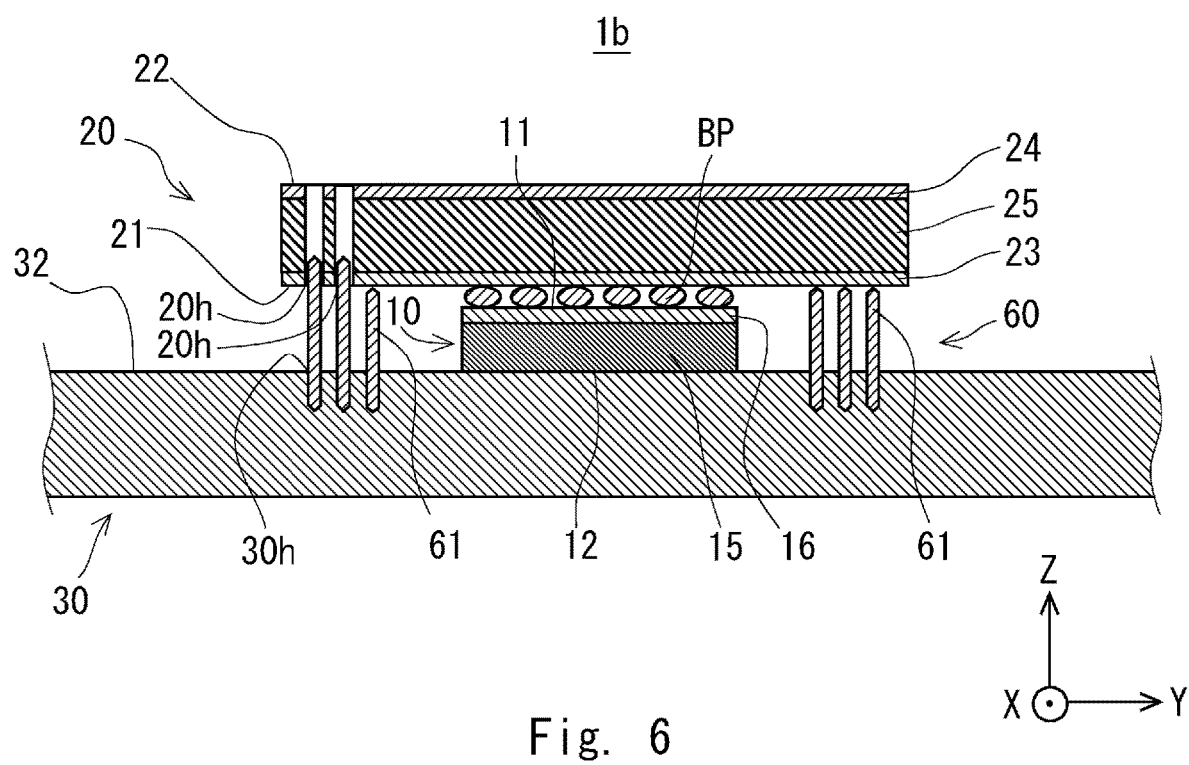
FIG. 6 is a cross-sectional view showing an example of holes formed in an interposer and movable pins according to a second modified example of the first example embodiment.

Next, a second modified example of the first example embodiment will be described. In this modified example, holes 20h in which movable pins 61 are inserted extend through the entire thickness of the interposer 20. FIG. 6 is a cross-sectional view showing an example of holes 20h of the interposer and movable pins 61 according to the second modified example of the first example embodiment. As shown in FIG. 6, in a quantum device 1b, the holes 20h in which the movable pins 61 are inserted extend from the mounting surface 21 to the opposite surface 22. In the case where the movable member 60 includes a plurality of movable pins 61, the same number of holes 20h as the number of movable pins 61 may extend through the interposer 20, or only one or several holes 20h may extend through the interposer 20.

By the above-described configuration, the positions of the one ends of the movable pins 61 are not restricted to the bottoms of the holes 20h, so that it is possible to improve the degree of flexibility as to the distance between the quantum device 1b and the sample stage 30.

(Third Modified Example)

Figure 7:
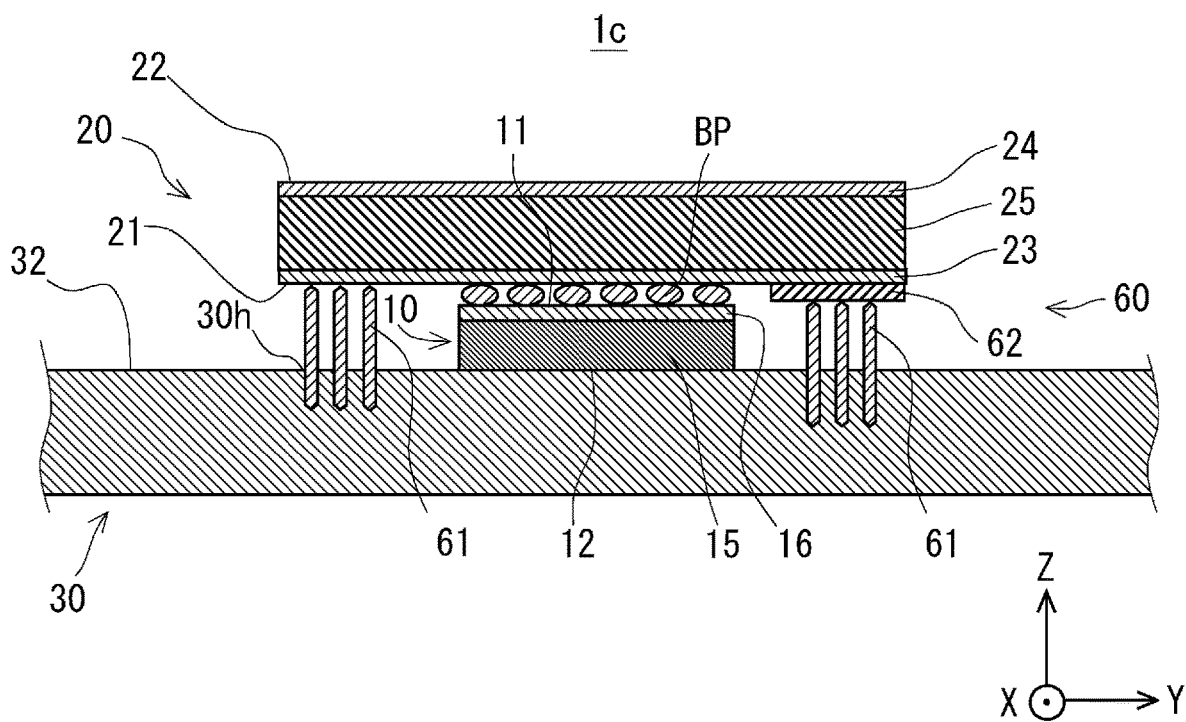
FIG. 7 is a cross-sectional view showing an example of a flat-plate part and movable pins according to a third modified example of the first example embodiment.

Next, a third modified example of the first example embodiment will be described. In this modified example, movable pins 61 are connected with the interposer 20 with a flat-plate part interposed therebetween. FIG. 7 is a cross-sectional view showing an example of the flat-plate part and the movable pins 61 according to the third modified example of the first example embodiment. As shown in FIG. 7, in a quantum device 1c, the movable member 60 includes movable pins 61 and a flat-plate part 62. The flat-plate part 62 has a planar shape, and includes one plate surface and the other plate surface opposite to the one plate surface. The movable member 60 may include only one flat-plate part 62 or a plurality of flat-plate parts 62.

The flat-plate part 62 preferably contains a material having high thermal conductivity. The flat-plate part may contain the same material as that contained in the movable pins 61, and/or may contain the above-described superconducting material. The flat-plate part 62 may contain the same superconducting material as that contained in the wiring layer 16 and the like, and/or a superconducting material different from that contained in the wiring layer 16 and the like. Further, the flat-plate part 62 may contain the above-described normal conductive material. The flat-plate part 62 may contain the same normal conductive material as that contained in the interposer wiring layer 24 and the like, and/or a normal conductive material different from that contained in the interposer wiring layer 24 and the like. Further, in the case of a flat-plate part 62 containing a conductive material, when it is necessary to prevent occurrences of electrical short circuits between the flat-plate part 62 and other members, the flat-plate part 62 may be covered with an insulating film. The flat-plate part 62 may contain ceramic having high thermal conductivity such as aluminum nitride.

For example, the one plate surface of the flat-plate part 62 is disposed so as to be in contact with the mounting surface 21. Further, the one ends of the movable pins 61 are brought into contact with the other plate surface of the flat-plate part 62. In this way, the movable pins 61 are contacted with the interposer 20 with the flat-plate part 62 interposed therebetween. The movable member 60 including the flat-plate part 62 is preferably disposed in the second area AR12 of the mounting surface 21. It is possible to prevent or reduce occurrences of electrical short circuits with the conductive wiring line CL1 by keeping the movable member 60 in contact with the second area AR12.

The movable member 60 including the flat-plate part 62 may be in contact with the first area AR11 of the mounting surface 21 of the interposer 20 as long as occurrences of electrical short circuits with the conductive wiring line CL1 are prevented. It is possible to improve the discharge of heat by keeping the movable member 60 in contact with the first area AR11, and thereby to improve the cooling performance of the quantum device 1.

The flat-plate part 62 may be kept in an electrically conductive state and a constant potential may be applied thereto. For example, the same potential as that of the sample stage 30, such as the ground potential, may be applied to the flat-plate part 62 through the movable pins 61. In this way, the wiring line and the circuit in the interposer 20 that are not electrically connected to the quantum chip 10 can obtain a constant potential such as the ground potential from the flat-plate part 62. Note that, in such a case, the flat-plate part 62 preferably contains an electrically conductive material having high thermal conductivity.

According to the quantum device 1c, the movable pins 61 are connected with the interposer 20 with the flat-plate part 62 interposed therebetween, so that it is possible to disperse the force that the interposer 20 receives from the movable pins 61, which would otherwise be concentrated at one point, by the flat-plate part 62. Further, it is possible to make the flat-plate part 62 function as a heat sink and thereby to improve the dissipation of heat.

(Fourth Modified Example)

Figure 8:
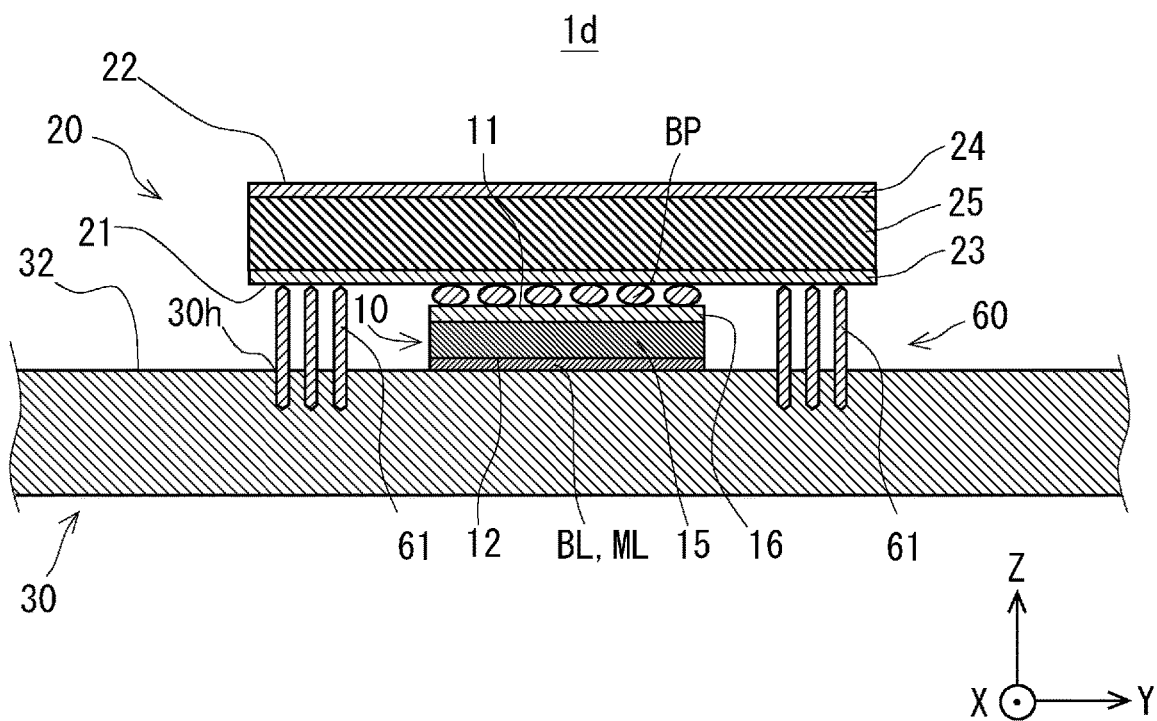
FIG. 8 is a cross-sectional view showing an example of a bonding layer or a junction layer according to a fourth modified example of the first example embodiment.

Next, a fourth modified example of the first example embodiment will be described. This modified example includes a bonding layer or a junction layer between the quantum chip 10 and the sample stage 30. FIG. 8 is a cross-sectional view showing an example of a bonding layer or a junction layer according to the fourth modified example of the first example embodiment. As shown in FIG. 8, in a quantum device 1d according to the fourth modified example, at least a part of the second surface 12 of the quantum chip 10 may be bonded or joined to the sample stage 30. For example, the second surface 12 may be bonded to a predetermined surface 32 of the sample stage 30, such as the upper surface thereof, by a bonding layer BL made of varnish, grease, or the like. Further, the second surface 12 may be joined by the sample stage 30 by using a junction layer ML, which is, for example, a metal layer, formed between the chip substrate 15 and the sample stage 30. By the above-described configuration, it is possible to improve the stability of the mounted quantum chip 10, and thereby to improve the accuracy of the position thereof. Further, the thermal connection with the sample stage 30 can be improved.

The bonding layer BL or the junction layer ML may be disposed over the entire surface of the second surface 12, or may be disposed on at least a part of the second surface 12, such as the periphery of the second surface 12 or the center of the second surface 12. For example, the bonding layer BL or the junction layer ML may be formed so as to avoid the area where the quantum circuit 17 is formed as viewed from above. In the case where the bonding layer BL is made of an insulating material, there is a risk that the bonding layer BL may act as a capacitor and resonate with the quantum circuit 17, causing a loss in the overall energy. It is possible to prevent or reduce the resonance by disposing the bonding layer BL so as to avoid the area where the quantum circuit 17 is formed.

Further, when the junction layer ML is electrically conductive such as when the junction layer ML is a metal layer, the ground potential of the quantum chip 10 may be obtained from the sample stage 30 through the junction layer ML, that is, the potential specified in the sample stage 30 may be obtained.

(Fifth Modified Example)

Figure 9:
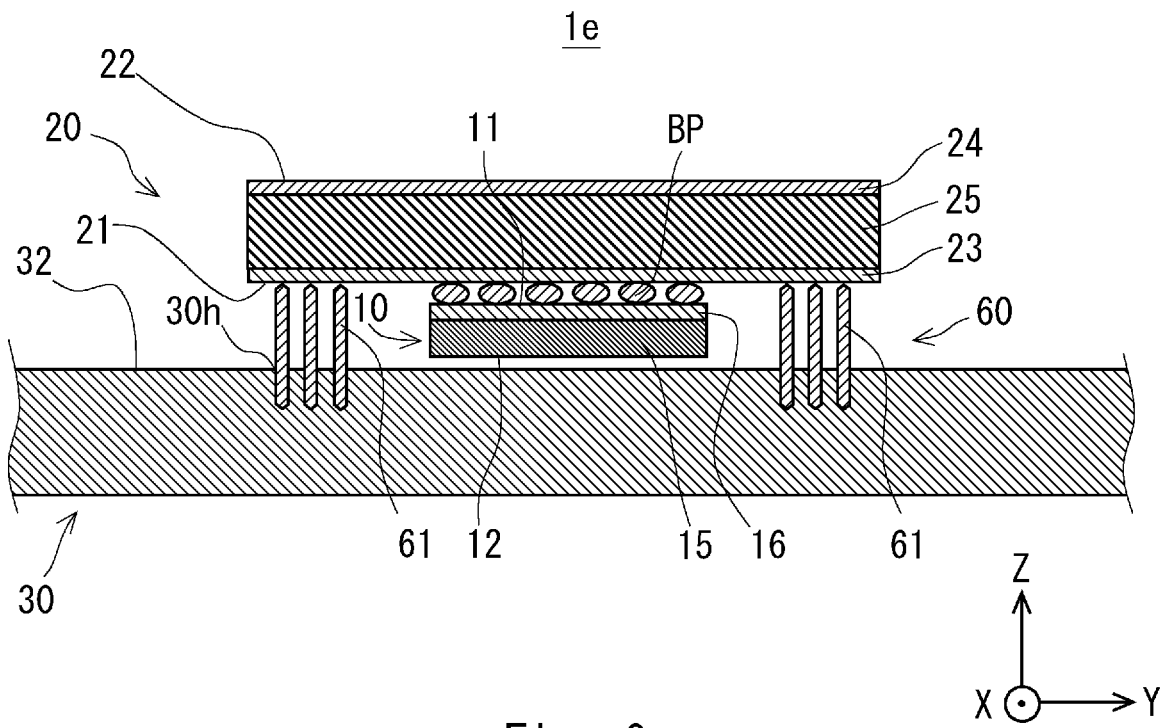
FIG. 9 is a cross-sectional view showing an example of a space between a quantum chip and a sample stage according to a fifth modified example of the first example embodiment.

Next, a fifth modified example of the first example embodiment will be described. In this modified example, there is a space between the quantum chip 10 and the sample stage 30. FIG. 9 is a cross-sectional view showing an example of a space between the quantum chip 10 and the sample stage 30 according to the fifth modified example of the first example embodiment. As shown in FIG. 9, in a quantum device 1e according to the fifth modified example, the quantum chip 10 does not have to be in contact with the sample stage 30. That is, the second surface 12 of the quantum chip 10 may be disposed in such a manner that a space is formed between the second surface 12 and the sample stage 30. By the above-described configuration, it is possible to reduce the stress and the strain caused by the difference between the thermal contraction of the quantum chip 10 caused by the change of the temperature to an extremely low temperature and that of the sample stage 30.

(Sixth Modified Example)

Figure 10:
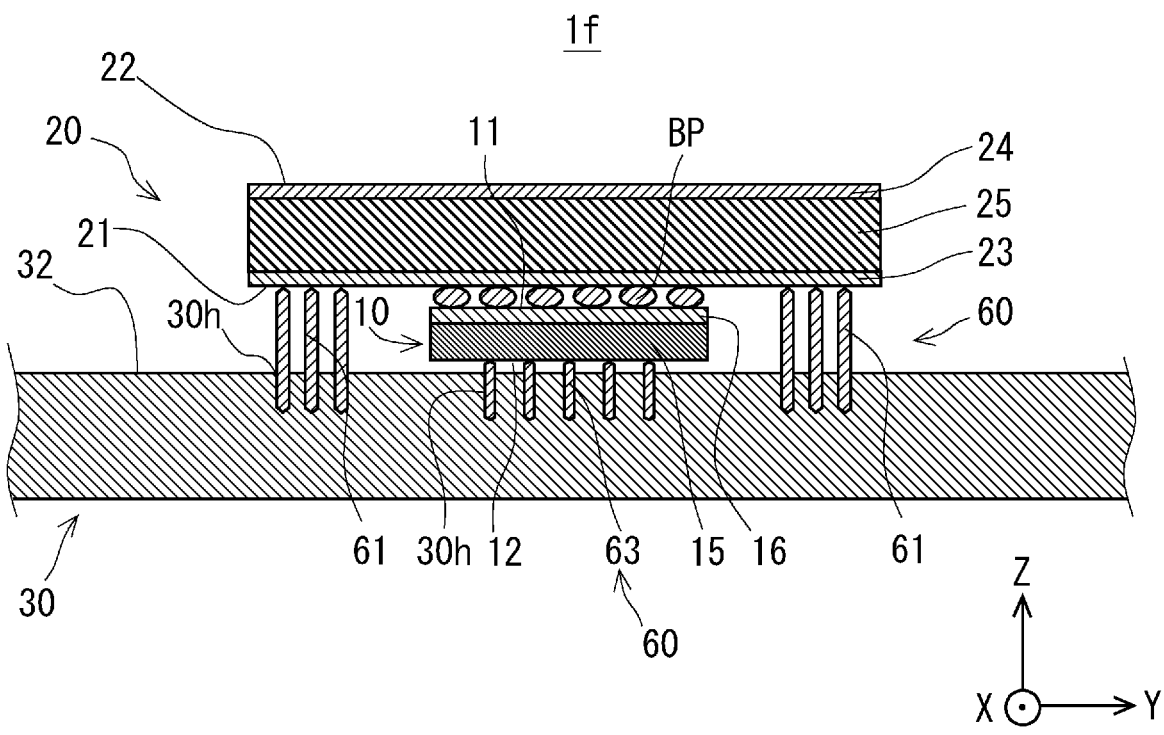
FIG. 10 is a cross-sectional view showing an example of chip pins that are in contact with a second surface of a quantum chip according to a sixth modified example of the first example embodiment.

Next, a sixth modified example according to the first example embodiment will be described. This modified example includes chip pins that are in contact with the second surface 12 of the quantum chip 10. FIG. 10 is a cross-sectional view showing an example of chip pins that are in contact with the second surface 12 of the quantum chip 10 according to the sixth modified example of the first example embodiment. As shown in FIG. 10, in a quantum device 1f according to the sixth modified example, the movable member 60 includes chip pins 63 that are movable relative to the sample stage 30 so as to protrude from the sample stage 30. The chip pins 63 are in contact with the second surface 12 of the quantum chip 10.

The movable member 60 may include only one chip pin 63 or a plurality of chip pins 63. Each of the chip pins 63 is, for example, a narrow pin-like member extending in the longitudinal direction, and includes one end and the other end. The other end of the chip pin 63 may be provided with, for example, an elastic member such as a coil spring or a leaf spring. For example, holes 30h are formed in the upper surface of the sample stage 30. Further, the other ends of the chip pins 63 are inserted into the holes 30h formed in the sample stage 30. In this way, the one ends of the chip pins 63 protrude from the upper surface of the sample stage 30. By the above-described configuration, the chip pins 63 are movable relative to the sample stage 30 so as to protrude from the sample stage 30.

The chip pins 63 preferably contain a material having high thermal conductivity, and preferably contain a material similar to that contained in the movable pins 61. The chip pins 63 may contain the same material as that contained in the sample stage 30, and/or may contain the above-described superconducting material. Further, the chip pins 63 may contain the above-described normal conductive material. In the case of chip pins 63 containing a conductive material, when it is necessary to prevent occurrences of electrical short circuits between the chip pins 63 and other members, the chip pins 63 may be covered with an insulating film. Further, the chip pins 63 may contain ceramic having high thermal conductivity such as aluminum nitride.

The chip pins 63 may be kept in an electrically conductive state and a constant potential may be applied thereto. For example, the ground potential may be applied to the chip pins 63, or a potential specified in the sample stage 30 may be applied thereto. In this way, the quantum chip 10 can obtain a constant potential such as the ground potential from the chip pins 63. Note that, in such a case, the chip pins 63 preferably contain an electrically conductive material having high thermal conductivity.

Similarly to the insertion of the movable pins 61 into the holes 20h formed in the interposer 20, the chip pins 63 may be inserted into holes (not shown) formed in the second surface 12 of the quantum chip 10. The holes formed in the second surface 12 may extend from the first surface 11 to the second surface 12. Further, the chip pins 63 may be connected with the second surface 12 of the quantum chip 10 with a flat-plate part 62 interposed therebetween.

According to the quantum device 1f, since the chip pins 63 are in contact with the second surface 12 of the quantum chip 10, the cooling performance can be improved. Further, it is possible to reduce the stress and the strain caused by the difference between the thermal contraction of the quantum chip 10 caused by the change of the temperature to an extremely low temperature and that of the sample stage 30.

(Seventh Modified Example)

Figure 11:
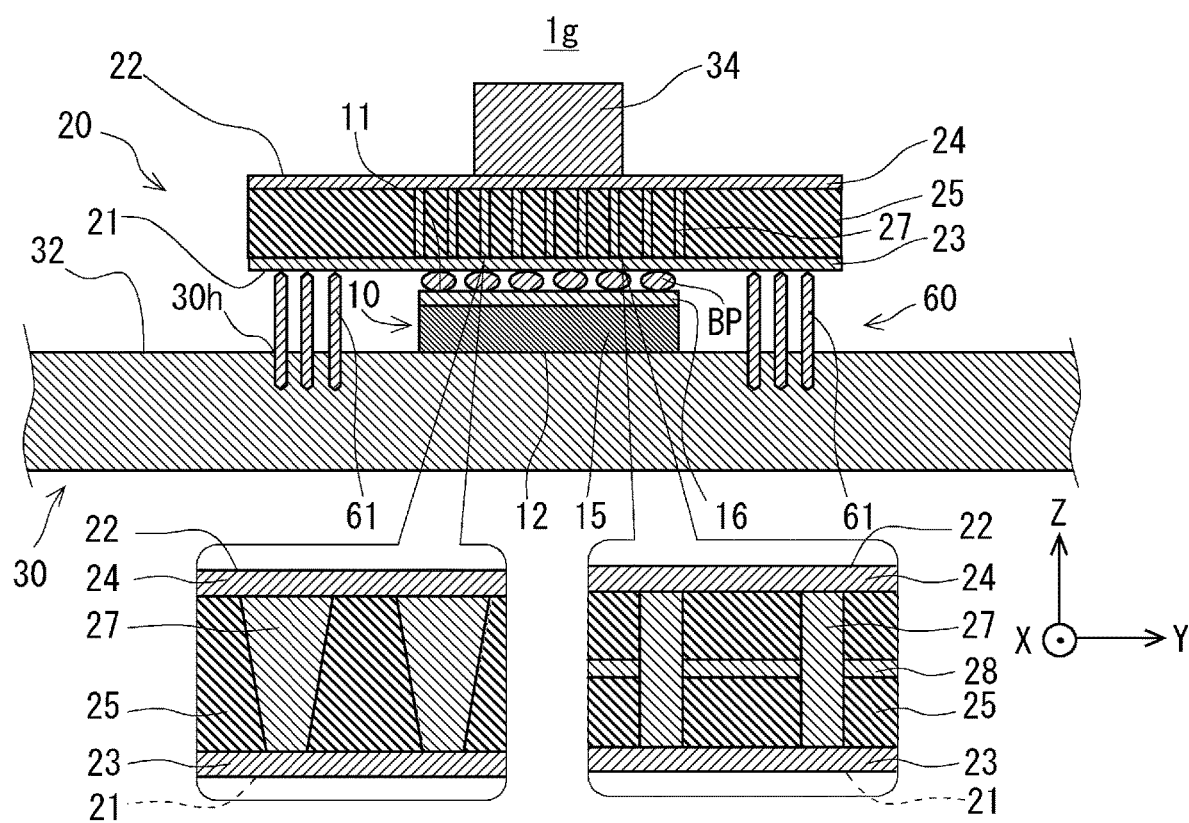
FIG. 11 is a cross-sectional view showing an example of a cooling member and thermal vias according to a seventh modified example of the first example embodiment.

Next, a seventh modified example of the first example embodiment will be described. This modified example includes a cooling member on the opposite surface 22 of the interposer 20, and includes thermal vias (i.e., thermal vias and a conductive material with which the thermal vias are filled) inside the interposer 20. FIG. 11 is a cross-sectional view showing an example of a cooling member and thermal vias according to a seventh modified example of the first example embodiment. In FIG. 11, illustration of the TVs 26 of the interposer 20 is omitted in order to prevent the drawing from becoming too complicated. As shown in FIG. 11, in a quantum device 1g according to the seventh modified example, the opposite surface 22 of the interposer 20 may be in contact with a cooling member 34. The cooling member 34 has a cooling function. For example, the cooling member 34 may have a cooling function that is obtained as the cooling member 34 comes into contact with the sample stage 30. By the above-described configuration, it is possible to cool the opposite surface 22 of the interposer 20 by thermal conduction to the cooling member 34, and thereby to improve the cooling performance.

Further, the interposer 20 may include thermal vias 27. The thermal vias 27 may be members that extend in a direction perpendicular to the mounting surface 21 of the interposer substrate 25. For example, the thermal vias 27 may extend through the interposer substrate 25. As described above, the interposer 20 may include thermal vias 27 extending from the mounting surface 21 side of the interposer substrate 25 to the opposite surface 22 side thereof. Each of the thermal vias 27 may has, for example, a columnar shape, such as a circular pillar shape or a square pillar shape, having a central axis extending in the direction perpendicular to the mounting surface 21. The thermal vias 27 can transfer heat between the mounting surface 21 side and the opposite surface 22 side.

The thermal vias 27 preferably contain a material having high thermal conductivity. The thermal vias 27 may contain the above-described superconducting material. The thermal vias 27 may contain the same superconducting material as that contained in the wiring layer 16 and the like, and/or a superconducting material different from that contained in the wiring layer 16 and the like. Further, the thermal vias 27 may contain the above-described normal conductive material. The thermal vias 27 may contain the same normal conductive material as that contained in the interposer wiring layer 24 and the like, and/or a normal conductive material different from that contained in the interposer wiring layer 24 and the like. Further, the thermal vias 27 may contain ceramic having high thermal conductivity such as aluminum nitride.

The thermal vias 27 may be connected to the cooling member 34. By the above-described configuration, the cooling performance of the quantum device 1g can be improved. Note that the quantum device 1g may be provided only with the cooling member 34 without being provided with the thermal vias 27, or may be provided only with the thermal vias 27 without being provided with the cooling member 34. Further, the quantum device 1g may be provided with both the cooling member 34 and the thermal vias 27. Further, the movable pins 61 may be kept in contact with the thermal vias 27.

Further, as shown in a balloon in the figure, the thermal vias 27 may include a tapered part (or a tapered via) in which the diameter on the opposite surface 21 side is larger than that on the mounting surface 22 side. That is, the thermal vias 27 may include a part (or a thermal via) having a roughly truncated cone shape of which the diameter of the cross section increases toward the opposite surface 22 side. It is possible to increase the heat capacity by adopting the tapered shape and thereby to ease the abrupt temperature change. Therefore, it is possible to improve the stability of the thermal vias 27 against the temperature change. Further, in the case where the thermal vias 27 are in contact with the cooling member 34, the thermal junction area with the cooling member 34 increases. Therefore, it is possible to promote the heat transfer more effectively. It should be noted that when the temperature at the interface between the thermal via 27 and the through hole (i.e., the interface between the material with which the thermal via is filled and the inner wall surface of the thermal via) is changed from a room temperature to an extremely low temperature, in some cases, the adhesion force at the interface deteriorates. For example, if a force larger than the adhesive force is applied at the interface between the thermal via 27 and the through hole due to the thermal contraction or if a material having a low elastic modulus is used for the wall surface of the thermal via 27, the elastic modulus increases (molecules become motionless) at an extremely low temperature or lower, raising a possibility that exfoliation occurs due to the loss of the adhesive force. It is considered that when the exfoliation occurs, the position of the thermal via 27 (i.e., the material with which the thermal via is filled) may be shifted. However, since the thermal via 27 has the tapered shape, the contact surface at the interface between the thermal via 27 (i.e., the material with which the thermal via is filled) and the through hole can be maintained even though its vertical position may be shifted. A part having a protruding shape by which the contact between the thermal via 27 and the cooling member 34 is maintained even when the thermal via 27 is moved may be formed in the cooling member 34 in advance, so that the contact between the cooling member 34 and the thermal vias 27 is maintained.

Further, as shown in the other balloon in the figure, the interposer 20 may include a common connection member 28 that connects a plurality of thermal vias 27 to each other. For example, a plurality of thermal vias 27 may be connected to each other by a plate-like connection member 28 disposed parallel to the mounting surface 21. The connection member 28 preferably contains a material having high thermal conductivity, and may contain a material similar to that contained in the thermal vias 27. The plurality of thermal vias 27 connected by the connection member 28 can increase the heat capacity and thereby reduce the temperature change. Further, the movable pins 61 may be connected with the connection member 28 with the thermal vias 27 interposed therebetween. Further, a constant potential may be applied to the plurality of thermal vias 27 which are connected to each other by the connection member 28. For example, a ground potential may be applied to the plurality of thermal vias 27. In this way, the quantum chip 10 or the interposer 20 can obtain the ground potential from the thermal vias 27. Note that, in such a case, the thermal vias 27 and the connection member 28 preferably contain an electrically conductive material having high thermal conductivity.

In the interposer 20, an area in which the quantum circuit 17 is mounted, i.e., an area in which the conductive wiring lines CL1 and Cl2 and signal lines electrically connected to the quantum chip 10 are mounted generates a larger amount of heat than the other areas do. Therefore, the density of thermal vias 27 in such an area is preferably made higher than the density thereof in the other areas. For example, when the quantum chip 10 is mounted at the center of the interposer 20 as viewed from above the interposer substrate 25, the density of thermal vias 27 in the central area is made higher than the density thereof in the peripheral area. Further, in the interposer 20, the density of thermal vias 27 near the TVs 26, which are used to transmit signals from the quantum circuit 17, is preferably made higher than the density thereof in the other areas. Further, the density of thermal vias 27 in the first areas AR11 and AR21 may be made higher than the density thereof in the second areas AR12 and AR22. In this way, the cooling performance can be improved.

(Eighth Modified Example)

Figure 12:
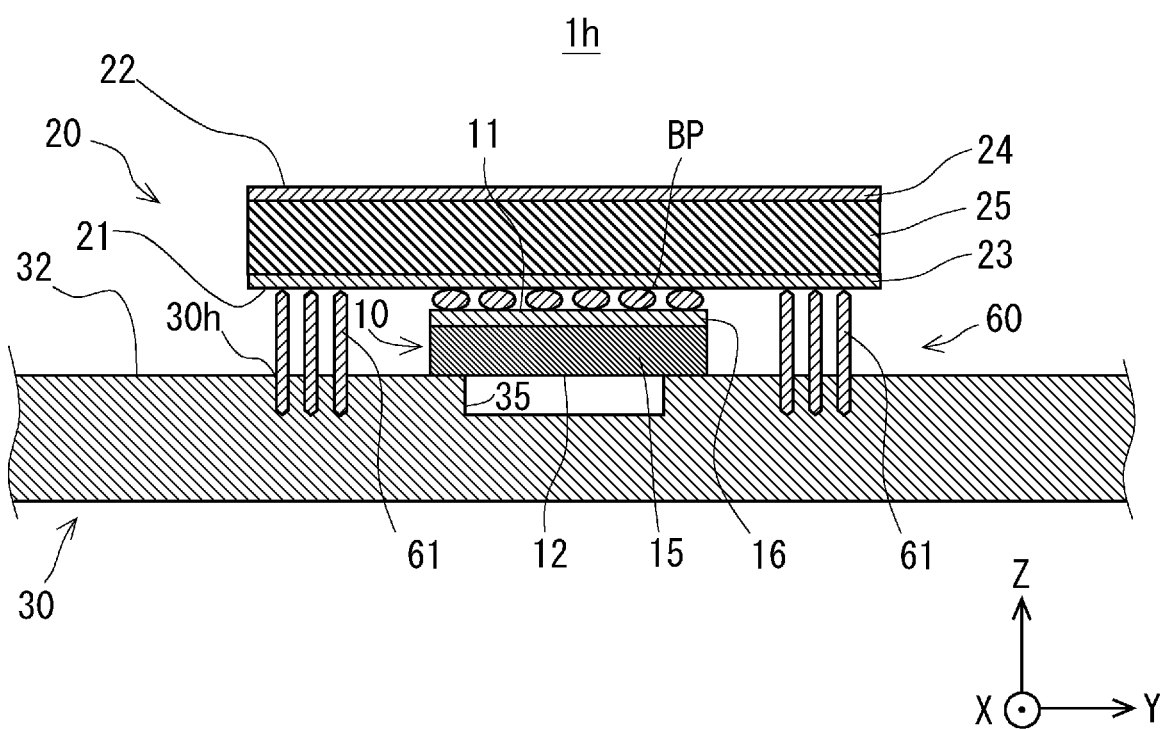
FIG. 12 is a cross-sectional view showing an example of a recess formed in a sample stage according to an eighth modified example of the first example embodiment.
Figure 13:
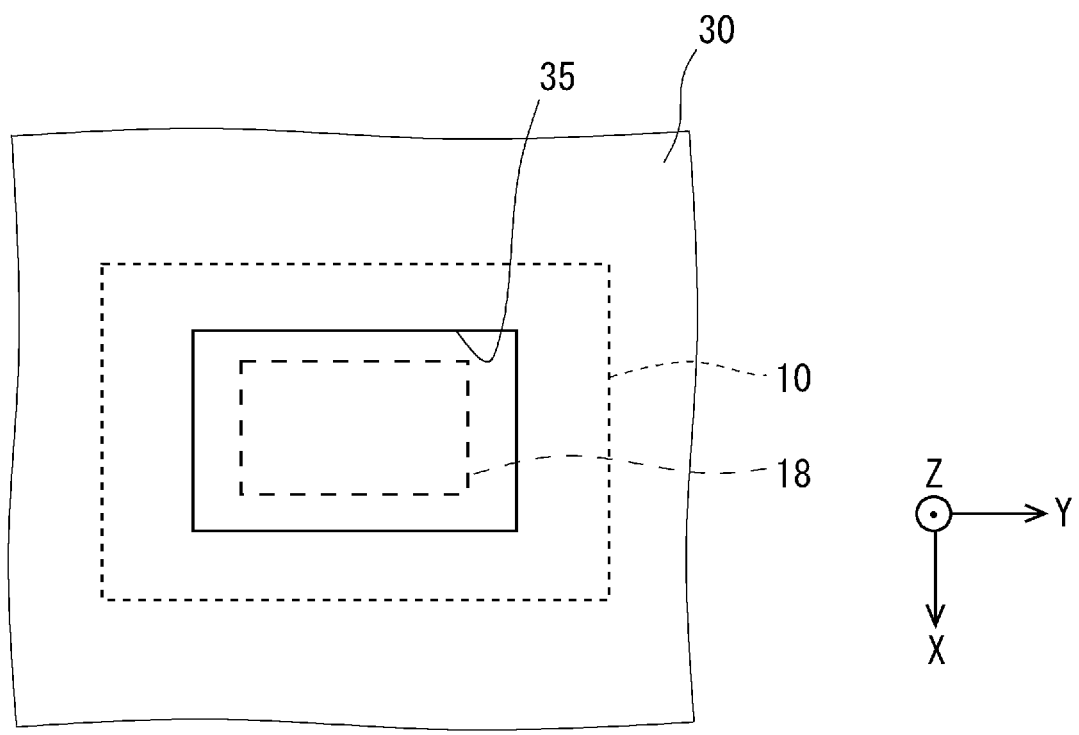
FIG. 13 is a plan view showing the example of the recess formed in the sample stage according to the eighth modified example of the first example embodiment.

Next, an eighth modified example of the first example embodiment will be described. In this modified example, a recess is provided (e.g., formed) in the sample stage 30. FIG. 12 is a cross-sectional view showing an example of a recess formed in the sample stage 30 according to the eighth modified example of the first example embodiment. FIG. 13 is a plan view showing the example of the recess formed in the sample stage 30 according to the eighth modified example of the first example embodiment. As shown in FIGS. 12 and 13, in a quantum device 1h according to the eighth modified example, a recess 35 is formed in the sample stage 30. As shown in FIG. 13, the area of the recess 35 is larger than an area 18 in which the quantum circuit 17 is formed as viewed from above. Therefore, the area 18 where the quantum circuit 17 is formed is included in the area of the recess 35. The periphery of the second surface 12 of the quantum chip 10 may be in contact with the sample stage 30. The central part of the second surface 12 of the quantum chip 10 covers the recess 35.

The area of recess 35 may be larger than the quantum chip 10 as viewed from above. In such a case, the second surface 12 of the quantum chip 10 is not in contact with the bottom of the recessed part 31.

In the quantum device 1h, as viewed from above, since the area of the recess 35 is larger than the area 18 in which the quantum circuit 17 is formed, it is possible to increase the distance between the area 18 in which the quantum circuit 17 is formed and the sample stage 30 containing a metal or the like. In this way, it is possible to prevent a pseudo capacitor from being formed and thereby to reduce the influence of the resonance that occurs in the main material, such as silicon, of the chip substrate 15. Therefore, it is possible to reduce the influence on the operating frequency of the quantum circuit 17.

(Ninth Modified Example)

Figure 14:
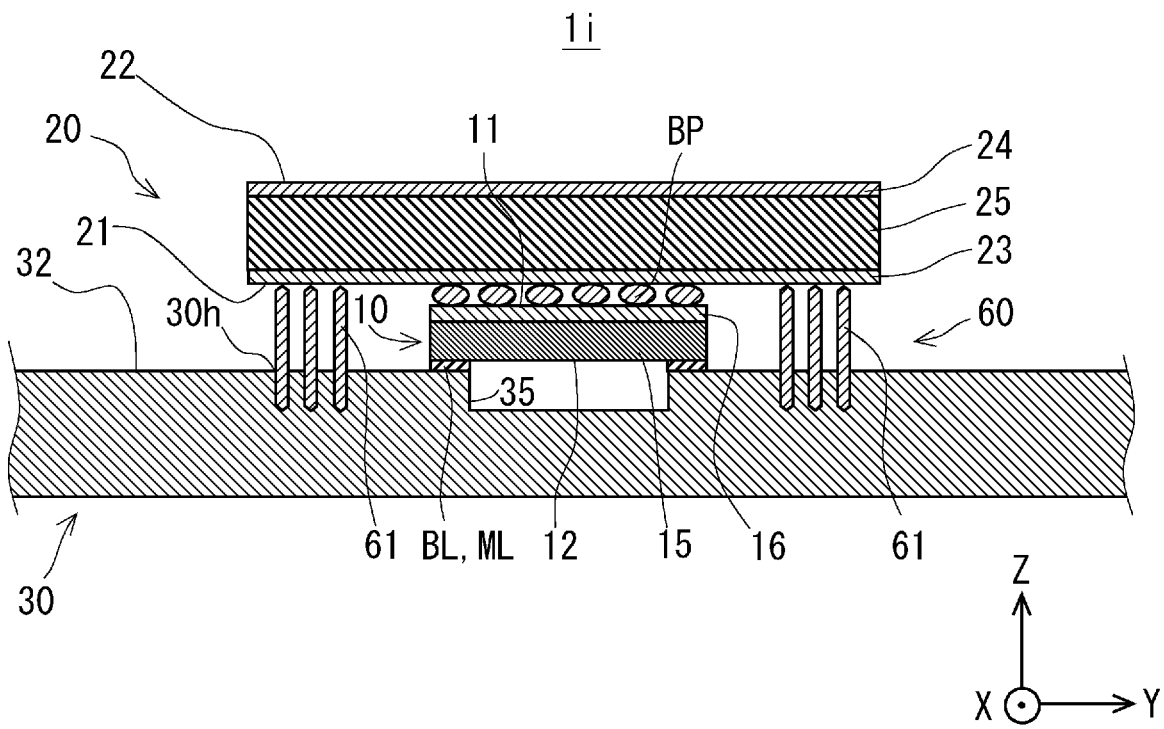
FIG. 14 is a cross-sectional view showing an example of a recess formed in a sample stage according to a ninth modified example of the first example embodiment.

Next, a ninth modified example of the first example embodiment will be described. In this modified example, the periphery of the second surface 12 of the quantum chip 10 is bonded or joined to the periphery of the recess 35. FIG. 14 is a cross-sectional view showing an example of a recess 35 formed in the sample stage 30 according to the ninth modified example of the first example embodiment. As shown in FIG. 14, in a quantum device 1i according to the ninth modified example, the periphery of the second surface 12 of the quantum chip 10 may be bonded to the sample stage 30 by a bonding layer BL, or may be joined thereto by a junction layer ML, which is, for example, a metal layer. By the above-described configuration, it is possible to improve the stability of the mounted quantum chip 10 while recuing the influence of the resonance, and thereby to improve the accuracy of the position thereof. Further, the thermal connection with the sample stage 30 can be improved.

(Tenth Modified Example)

Figure 15:
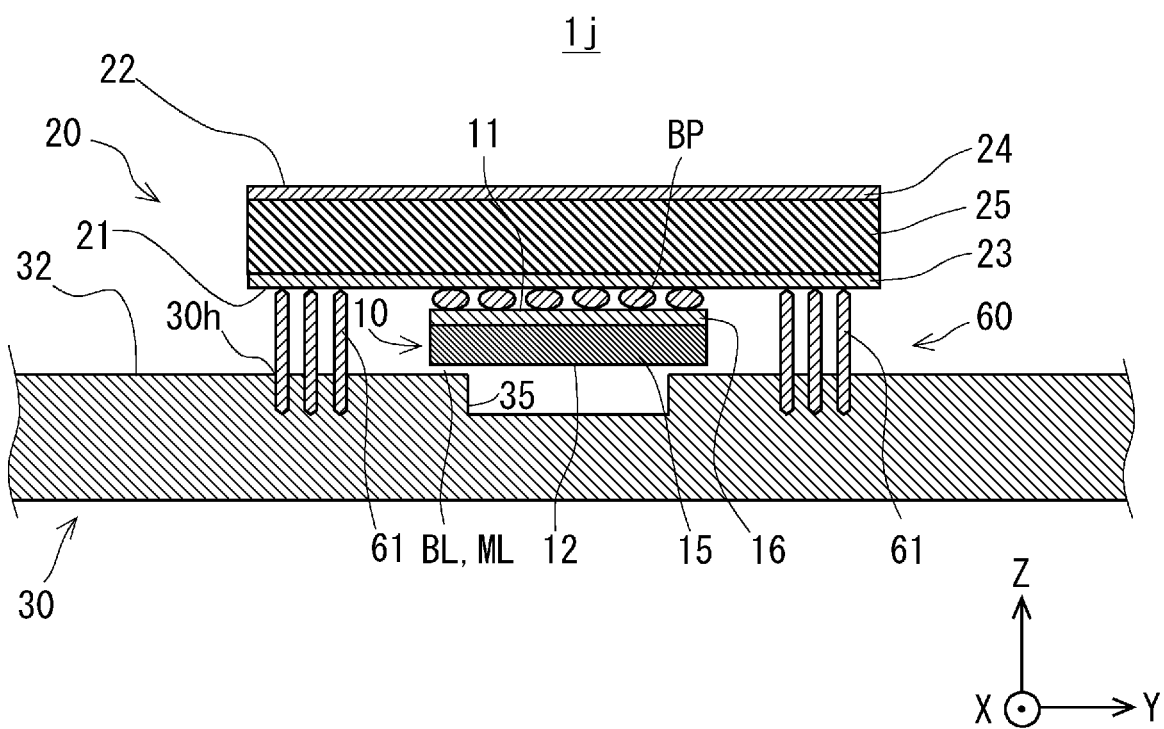
FIG. 15 is a cross-sectional view showing an example of a recess formed in a sample stage according to a tenth modified example of the first example embodiment.

Next, a tenth modified example of the first example embodiment will be described. This modified example includes a space between the periphery of the second surface 12 of the quantum chip 10 and the periphery of the recess 35. FIG. 15 is a cross-sectional view showing an example of a recess 35 formed in the sample stage 30 according to the tenth modified example of the first example embodiment. As shown in FIG. 1, in a quantum device 1j according to the tenth modified example, the periphery of the second surface 12 of the quantum chip 10 does not have to be in contact with the sample stage 30. That is, the periphery of the second surface 12 of the quantum chip 10 may be disposed in such a manner that a space is formed between the periphery of the second surface 12 and the sample stage 30. By the above-described configuration, it is possible to reduce the stress and the strain caused by the difference between the thermal contraction of the quantum chip 10 caused by the change of the temperature to an extremely low temperature and that of the sample stage 30 while reducing the influence of the resonance.

(Eleventh Modified Example)

Figure 16:
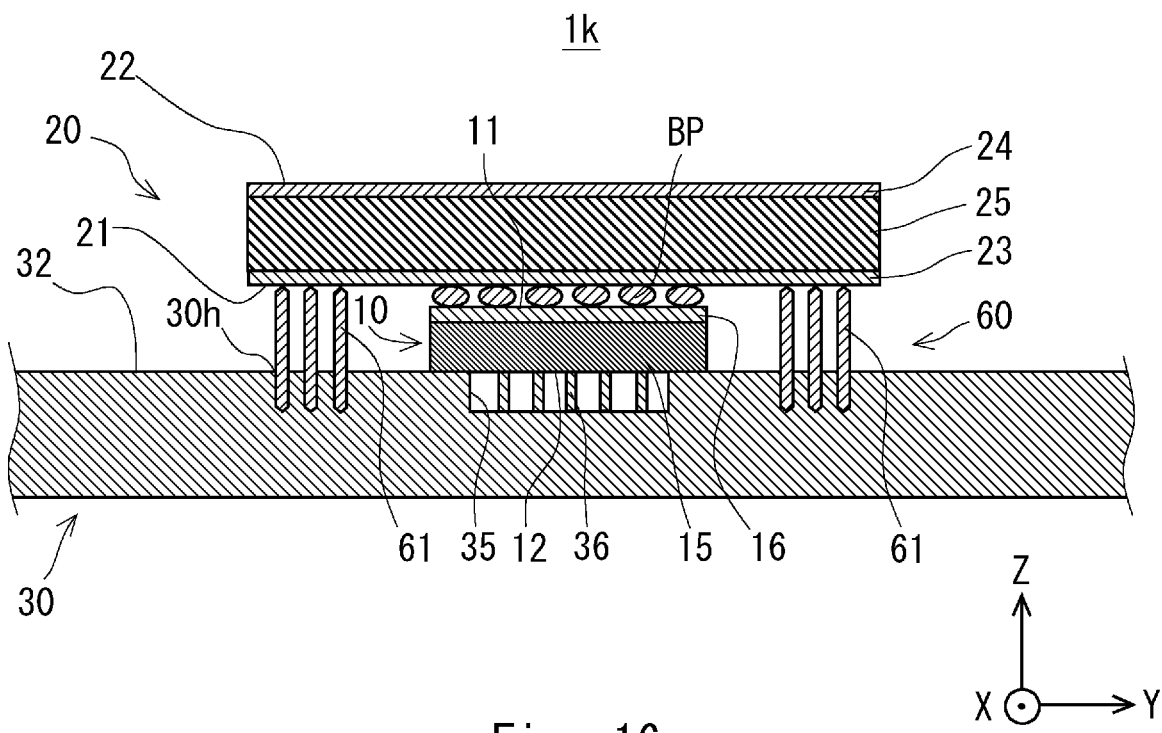
FIG. 16 is a cross-sectional view showing an example of a recess formed in a sample stage and pillars according to an eleventh modified example of the first example embodiment.

Next, an eleventh modified example of the first example embodiment will be described. This modified example includes pillars in the recess 35. FIG. 16 is a cross-sectional view showing an example of a recess 35 formed in the sample stage 30 and pillars according to the eleventh modified example of the first example embodiment. As shown in FIG. 16, in the quantum device 1k according to the eleventh modified example, the recess 35 is formed in the sample stage 30. Further, one or a plurality of pillars 36 are provided in the recess 35. The pillars 36 extend in a direction perpendicular to the first and second surfaces 11 and 12. One end of each pillar 36 is in contact with the second surface 12 of the quantum chip 10, and the other end of the pillar 36 is connected to the sample stage 30. As described above, the quantum chip 10 is in contact with the pillars 36 which extend from the sample stage 30 in a direction perpendicular to the first surface 11. The pillars 36 may be circular pillars or square pillars. The pillars 36 may contain a material similar to that contained in the chip pins 63. The one or plurality of pillars 36 and the second surface 12 may be bonded to each other by a bonding layer BL, or may be bonded by a metal layer.

In a quantum device 1k, as viewed from above, since the area of the recess 35 is larger than the area 18 in which the quantum circuit 17 is formed, it is possible to increase the distance between the area 18 in which the quantum circuit 17 is formed and the sample stage 30 containing a metal or the like. In this way, it is possible to reduce the influence of the resonance that occurs in the main material, such as silicon, of the chip substrate 15. In addition, since the pillars 36 are in contact with the second surface 12 of the quantum chip 10, the cooling performance can be improved.

Note that the pillars 36 may be configured so as to be movable beyond the bottom of the recess 35. That is, the pillars 36 may be used as a substitute for the chip pins 63.

(Twelfth Modified Example)

Figure 17:
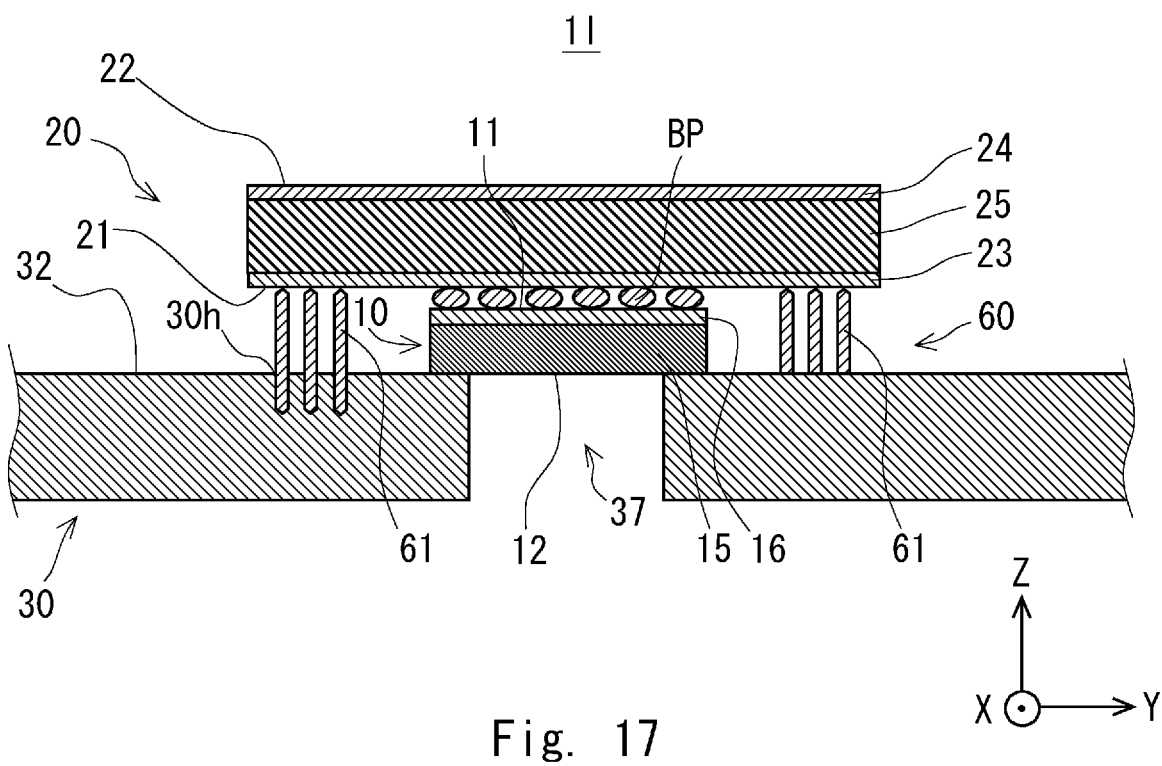
FIG. 17 is a cross-sectional view showing an example of a through hole formed in a sample stage according to a twelfth modified example of the first example embodiment.

Next, a twelfth modified example of the first example embodiment will be described. In this modified example, the sample stage 30 includes a through hole. FIG. 17 is a cross-sectional view showing an example of a through hole formed in the sample stage 30 according to the twelfth modified example of the first example embodiment. As shown in FIG. 17, in a quantum device 11 according to the twelfth modified example, a through hole 37 is formed in the sample stage 30. The area of the through hole 37 is larger than the area 18 in which the quantum circuit 17 is formed as viewed from above. Therefore, the area 18 where the quantum circuit 17 is formed is included in the area of the through hole 37. The periphery of the second surface 12 of the quantum chip 10 may be in contact with the bottom of the recessed part 31, and/or may be bonded or joined to the bottom of the recessed part 31. The central part of the second surface 12 of the quantum chip 10 covers the through hole 37.

In the quantum device 11, as viewed from above, since the area of the through hole 37 is larger than the area 18 in which the quantum circuit 17 is formed, it is possible to increase the distance between the area 18 in which the quantum circuit 17 is formed and the sample stage 30 containing a metal or the like. In this way, it is possible to reduce the influence of the resonance that occurs in the main material, such as silicon, of the chip substrate 15. Therefore, it is possible to reduce the influence on the operating frequency of the quantum circuit 17. The first to twelfth modified examples of the first example embodiment have been described above, and two or more of them may be combined with one another as desired.

Second Example Embodiment

Figure 18:
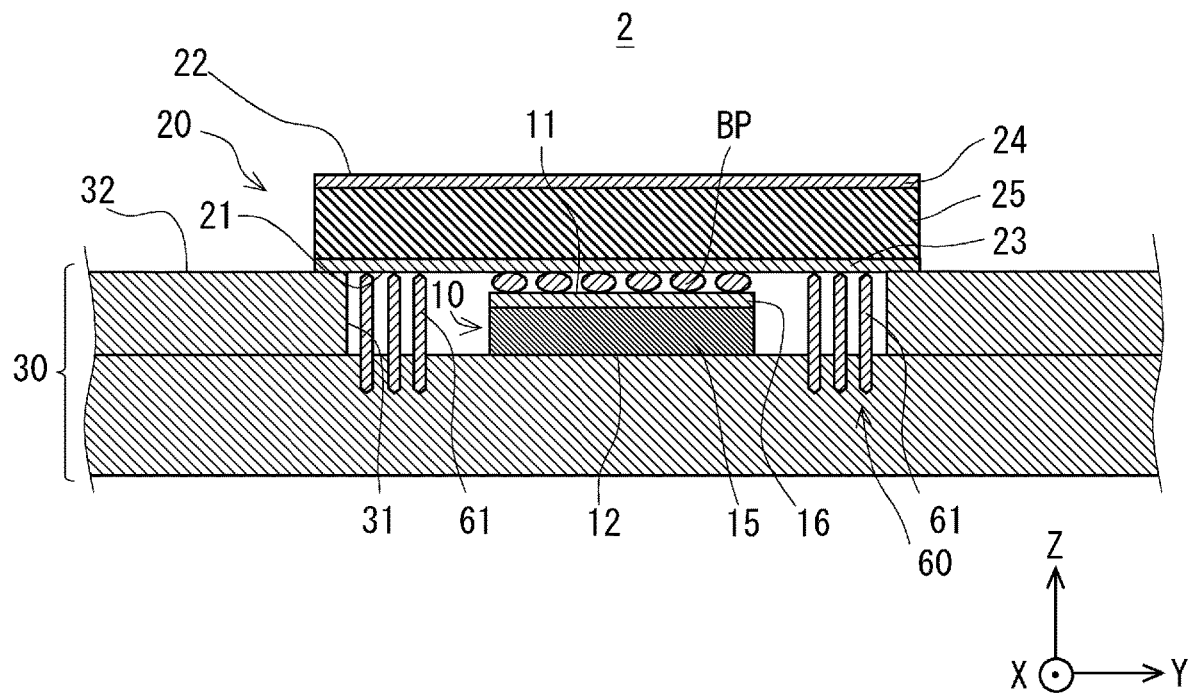
FIG. 18 is a cross-sectional view showing an example of a quantum device according to a second example embodiment.

Next, a quantum device according to a second example embodiment will be described. In the quantum device according to this example embodiment, the quantum chip 10 is disposed inside a recess formed in the sample stage 30. FIG. 18 is a cross-sectional view showing an example of a quantum device according to the second example embodiment. As shown in FIG. 18, in the quantum device 2, a recessed part 31 is formed in the sample stage 30. For example, the recessed part 31 is formed in a predetermined surface 32 of the sample stage 30. The predetermined surface 32 is, for example, an upper surface that faces in the Z-axis positive direction. The recessed part 31 is open toward the Z-axis positive direction side. The recessed part 31 has, for example, a rectangular shape as viewed from above.

The quantum chip 10 is smaller than the recessed part 31 as viewed from above through the interposer 20 (i.e., as viewed while assuming that the interposer 20 is transparent). Meanwhile, the interposer 20 is larger than the recessed part 31 as viewed from above. The quantum chip 10 is disposed inside the recessed part 30 formed in the sample stage 31 having the cooling function. Meanwhile, a part of the interposer 20 is in contact with the sample stage 30. For example, a part of the mounting surface 21 of the interposer 20 on which the quantum chip 10 is mounted is in contact with the upper surface of the sample stage 30.

In order to prevent electrical conduction with the sample stage 30, an insulating film may be formed in the part of the mounting surface 21 of the interposer 20 that is in contact with the sample stage 30, or an insulating spacer is disposed in that part of the mounting surface 21 of the interposer 20. Further, no interposer wiring layer 23 may be formed in the part of the mounting surface 21 that is in contact with the sample stage 30.

By bringing at least a part of the interposer 20 into contact with the sample stage 30 and thereby using the interposer 20 as a heat flow path, it is possible to cool the quantum circuit 17 of the quantum chip 10 to an extremely low temperature and thereby to use a superconducting phenomenon. Further, it is possible to improve the cooling performance even further by bringing the second surface 12 of the quantum chip 10 into contact with the inner surface of the recessed part 31. In order to improve the thermal insulating property for reducing the change in the temperature (hereinafter also referred to as the temperature change) around the quantum chip, the area (e.g., space) surrounding the quantum chip 10 is preferably in a vacuum state or a reduced-pressure atmosphere state.

Further, since the second surface 12 is in contact with the inner surface of the recessed part 31, it is possible to reduce the stress and the strain caused by the difference between the thermal contraction of the quantum chip 10 caused by the change of the temperature to an extremely low temperature and that of the sample stage 30.

By orientating the mounting surface 21 toward the sample stage 30, it is possible to make full use of the opposite surface 22 of the interposer 20 for the terminal(s) 24a through which information is acquired from the quantum chip 10. Therefore, it is possible to increase the number of terminals through which information is acquired.

Note that some of the modified examples of the first example embodiment may be applied to the second example embodiment. For example, since the bottom of the recessed part 31 is also a part of the sample stage 30, at least one of a bonding layer BL, a junction layer ML, a space, chip pins 63, a recess 35, pillars 36, and a through hole 37 may be provided between the second surface 12 of the quantum chip 10 and the bottom of the recessed part 31. The rest of the configuration and the advantageous effects have been already described in the description of the first example embodiment.

Third Example Embodiment

Figure 19:
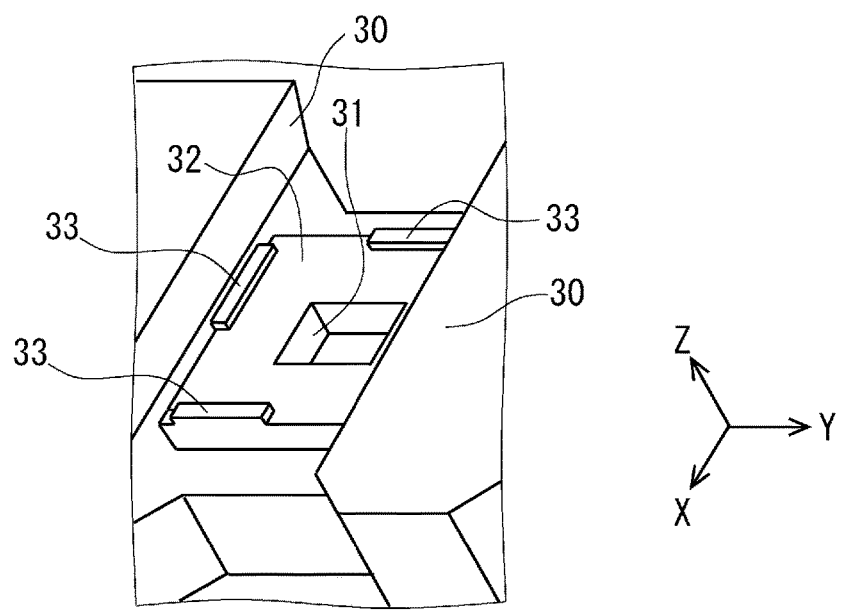
FIG. 19 is a perspective view showing an example of a recessed part 31 and pressing members of a sample stage 30 in a quantum device according to a third example embodiment.
Figure 20:
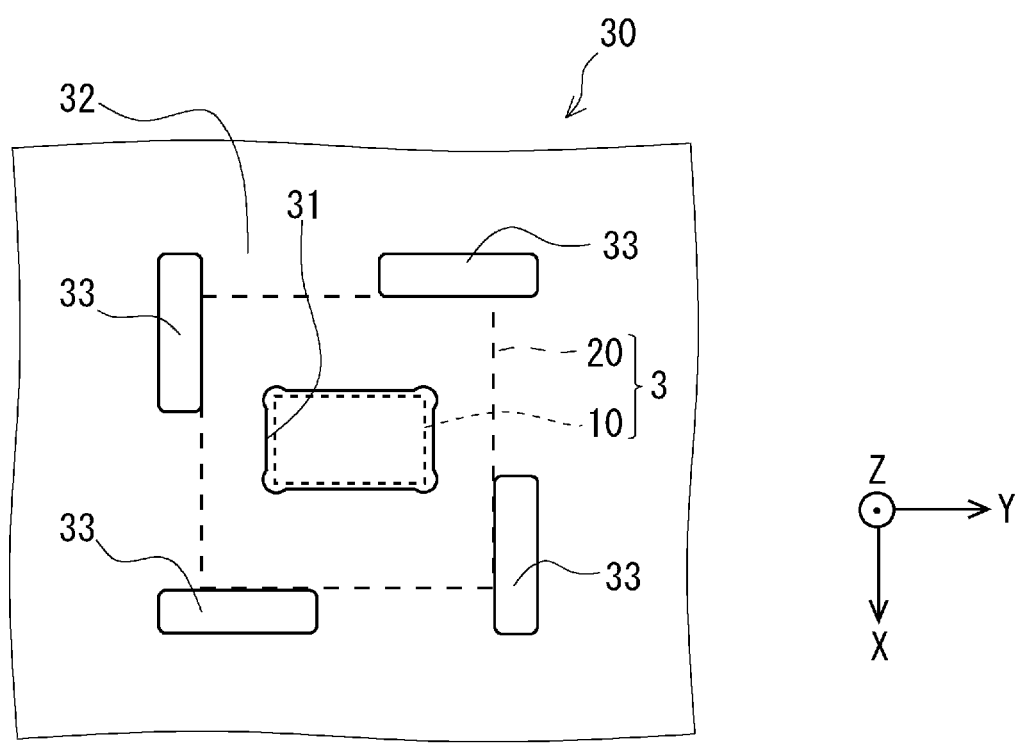
FIG. 20 is a plan view showing the example of the recessed part 31 and the pressing members of the sample stage 30 according to the third example embodiment.

Next, a quantum device according to a third example embodiment will be described. The quantum device according to this example embodiment includes pressing members on a predetermined surface 32 of the sample stage 30. FIG. 19 is a perspective view showing an example of a recessed part 31 and pressing members of the sample stage 30 in the quantum device according to the third example embodiment. FIG. 20 is a plan view showing the example of the recessed part 31 and the pressing members of the sample stage 30 in the quantum device according to the third example embodiment. As shown in FIGS. 19 and 20, in the quantum device 3, the recessed part 31 is formed in the predetermined surface 32 of the sample stage 30, which is, for example, the upper surface of the sample stage 30. Further, a plurality of pressing members 33 are provided around the recessed part 31 on the predetermined surface 32. For example, four pressing members 33 are provided on the predetermined surface 32.

At least a part of the side surface of the interposer 20 is in contact with the pressing members 33 disposed on the predetermined surface 32. For example, in the case where the interposer 20 has a rectangular shape as viewed from above, flat-surface parts of the plurality of pressing members 33 press parts of the side surface of the interposer 20 near the corners thereof. By the above-described configuration, the plurality of pressing members 33 can press, by the flat-surface parts thereof, diagonal parts of the side surface of the interposer 20 in a discontinuous manner (i.e., a distributed manner). Therefore, this feature enables the quantum chip 10 to linearly slide on the interposer 20 when the interposer 20 or the pressing members 33 contract at a low temperature, making it possible to make the contraction uniform. The rest of the configuration and the advantageous effects have been already described in the descriptions of the first and second example embodiments.

Fourth Example Embodiment

Figure 21:
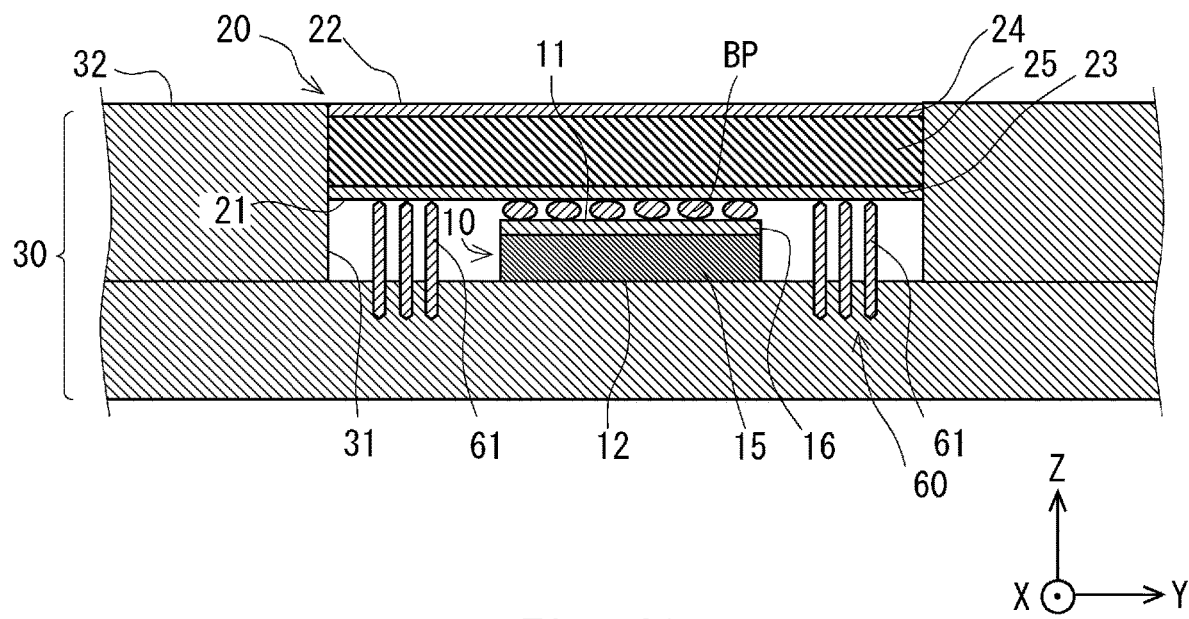
FIG. 21 is a cross-sectional view showing an example of a quantum device according to a fourth example embodiment.

Next, a fourth example embodiment will be described. In the quantum device according to this example embodiment, the side surface of the interposer 20 is in contact with the inner surface of the recessed part 31. FIG. 21 is a cross-sectional view showing an example of a quantum device according to the fourth example embodiment. As shown in FIG. 21, in the quantum device 4, at least a part of the side surface of the interposer 20 is in contact with the inner surface of the recessed part 31.

By the above-described configuration, since the mounting surface 21 of the interposer 20 does not have to be in contact with the sample stage 30, it is possible to make full use of the mounting surface 21. For example, the interposer wiring layer 23 can be formed on the mounting surface 21 to the maximum extent. The rest of the configuration and the advantageous effects have been already described in the descriptions of the first to third example embodiments.

Fifth Example Embodiment

Figure 22:
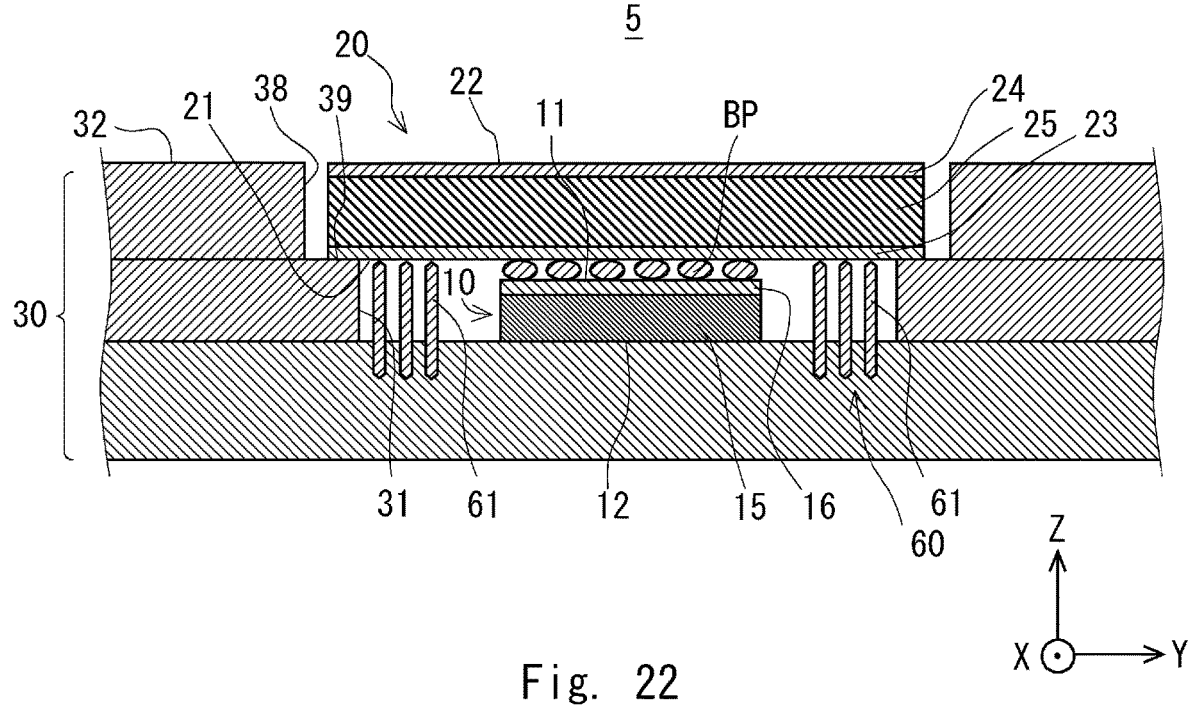
FIG. 22 is a cross-sectional view showing an example of a quantum device according to a fifth example embodiment.
Figure 23:
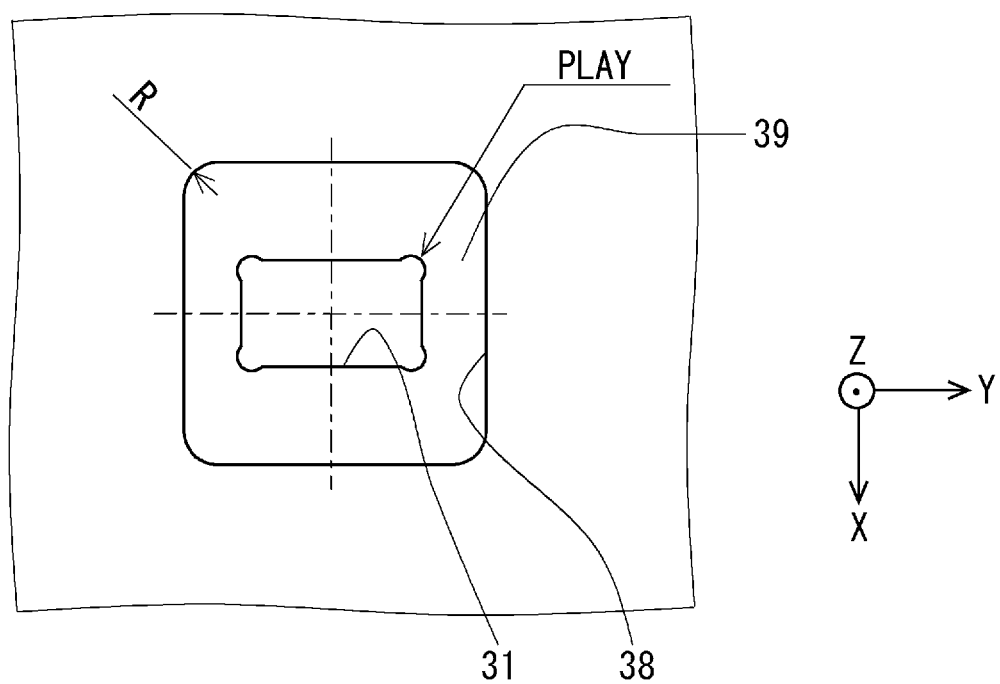
FIG. 23 is a plan view showing an example of a recessed part and a countersunk part of a sample stage according to a fifth example embodiment.

Next, a fifth example embodiment will be described. In this example embodiment, a countersunk part is formed in the recessed part 31. FIG. 22 is a cross-sectional view showing an example of a quantum device according to the fifth example embodiment. FIG. 23 is a plan view showing an example of the recessed part 31 and the countersunk part of the sample stage 30 according to the fifth example embodiment. As shown in FIGS. 22 and 23, in the quantum device 5, the recessed part 31 of the sample stage 30 is formed in a predetermined surface 32 of the sample stage 30. Further, a countersunk part 38 is formed around the mouth of the recessed part 31. As a result, a stepped surface 39 having a step (i.e., a difference in level) with respect to the predetermined surface 32 is formed around the mouth of the recessed part 31. Therefore, the countersunk part 38 includes the stepped surface 39.

The stepped surface 39 is, for example, parallel to the predetermined surface 32. The stepped surface 39 is formed around the recessed part 31. The stepped surface 39 surrounds the recessed part 31. The quantum chip 10 is disposed inside the recessed part 31. A part of the mounting surface 21 of the interposer 20 is in contact with the stepped surface 39.

An insulating film may be formed in the part of the interposer 20 that is in contact with the stepped surface 39 of the mounting surface 21 in order to prevent electrical conduction with the stepped surface 39. Further, no interposer wiring layer 23 may be formed in the part of the mounting surface 21 that is in contact with the stepped surface 39.

As shown in FIG. 23, a space is formed around the four sides of the recessed part 31 so that the quantum chip 10 can be placed therein. Further, the recessed part 31 may have such a shape that a circular part or an R-part is added to each of the four corners thereof. In this way, it is possible to prevent a stress and a strain from occurring due to the volume changes during the cooling to an extremely low temperature. In particular, it is possible to prevent the stress from being concentrated at the four corners which would otherwise be caused when the corners have right angles or acute angles.

In the quantum device 5 according to this example embodiment, since the interposer 20 is disposed inside the countersunk part 38, the interposer 20 is surrounded by the sample stage 30. Therefore, the cooling performance can be improved. Further, since a part of the mounting surface 21 of the interposer 20 is in contact with the stepped surface 39, the cooling performance can also be improved by this feature. Further, it is possible to reduce the step (i.e., the difference in level) between the predetermined surface 32 and the opposite surface 22, and thereby to improve the degree of flexibility as to how the quantum device 2m is placed. The rest of the configuration and the advantageous effects have been already described in the descriptions of the first to fourth example embodiments.

Sixth Example Embodiment

Figure 24:
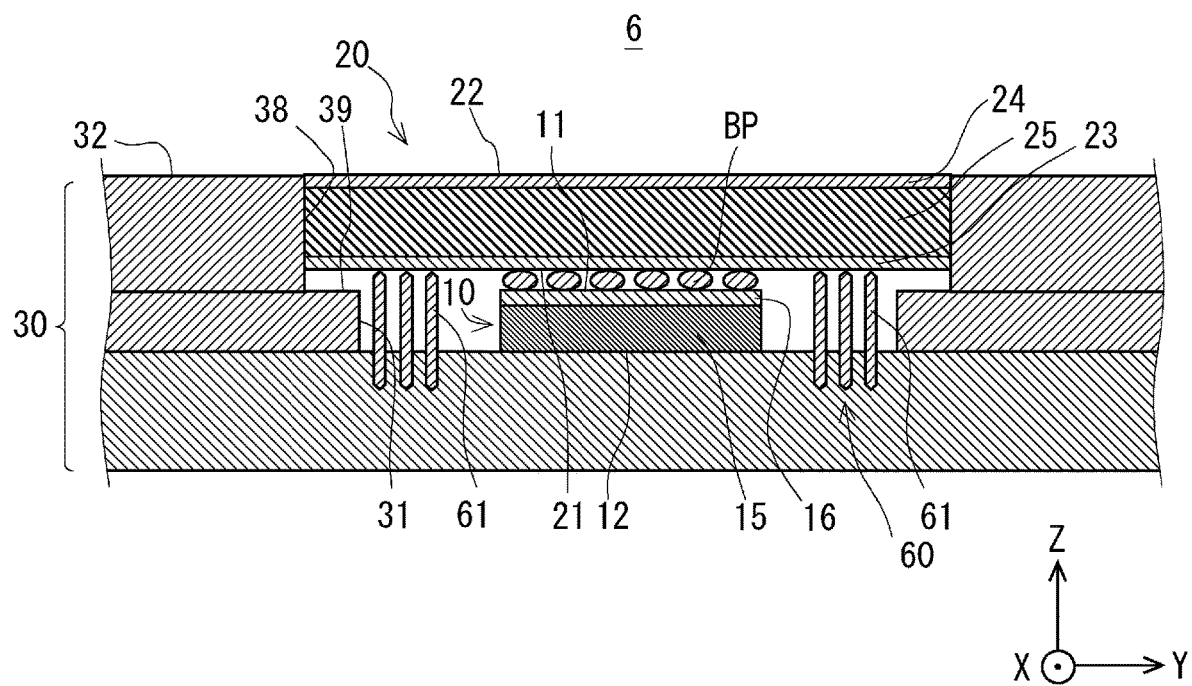
FIG. 24 is a cross-sectional view showing an example of a quantum device according to a sixth example embodiment.

Next, a sixth example embodiment will be described. In a quantum device according to this example embodiment, the interposer 20 is in contact with the side surface of the countersunk part 38. FIG. 24 is a cross-sectional view showing an example of a quantum device according to the sixth example embodiment. As shown in FIG. 24, in the quantum device 6, the recessed part 31 of the sample stage 30 is formed in a predetermined surface 32 of the sample stage 30. Further, a countersunk part 38 is formed around the mouth of the recessed part 31. As a result, a stepped surface 39 having a step (i.e., a difference in level) with respect to the predetermined surface 32 is formed around the mouth of the recessed part 31.

In the quantum device 6 according to this example embodiment, at least a part of the side surface of the interposer 20 is in contact with the side surface of the countersunk part 38 that is located between the stepped surface 39 and the predetermined surface 32. Further, a part of the mounting surface 21 of the interposer 20 is disposed in such a manner that a space is formed between the part of the mounting surface 21 and the stepped surface 39. In this way, since the mounting surface 21 of the interposer 20 does not have to be in contact with the sample stage 30, it is possible to make full use of the mounting surface 21. The rest of the configuration and the advantageous effects have been already described in the descriptions of the first to fifth example embodiments.

(Modified Example)

Figure 25:
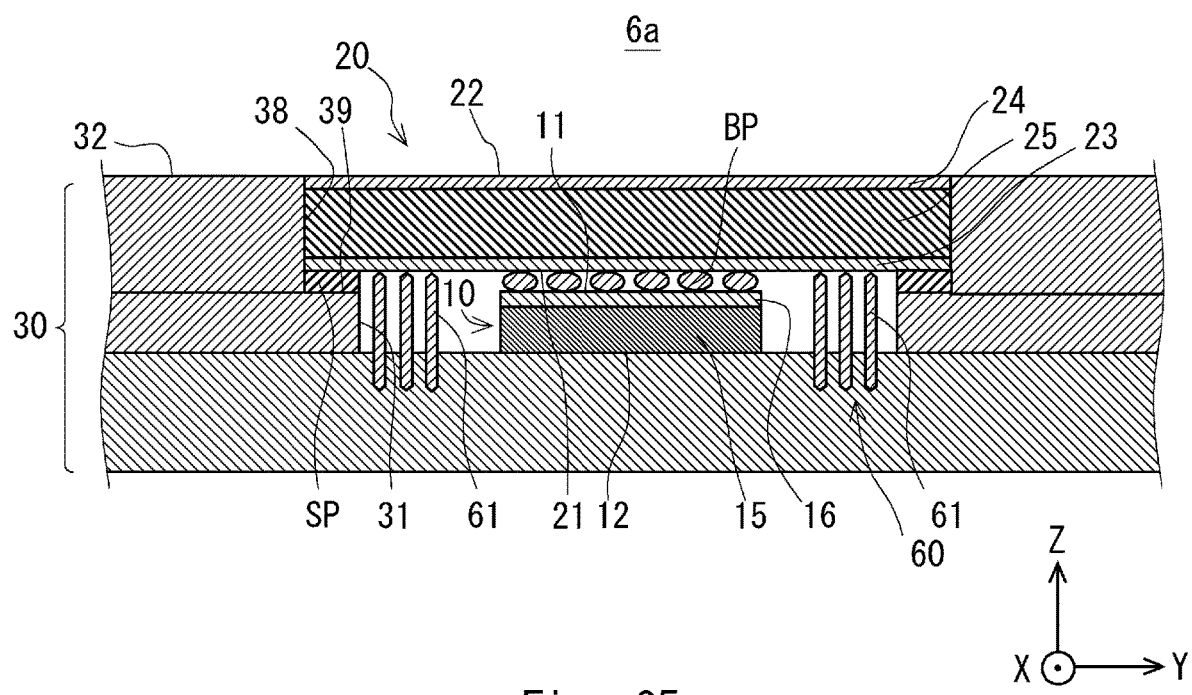
FIG. 25 is a cross-sectional view showing an example of a spacer according to a modified example of the sixth example embodiment.

Next, a modified example of the sixth example embodiment will be described. This modified example includes a spacer between the mounting surface 21 of the interposer 20 and the stepped surface 39. FIG. 25 is a cross-sectional view showing an example of a spacer according to the modified example of the sixth example embodiment. As shown in FIG. 25, in a quantum device 6a, a part of the mounting surface 21 of the interposer 20 is disposed in such a manner that a spacer SP is interposed between that part of the mounting surface 21 and the stepped surface 39. That is, the spacer SP is disposed between the mounting surface 21 and the stepped surface 39. The spacer SP preferably contains an insulating material having high thermal conductivity, such as aluminum nitride, silicon carbide, sapphire, silicon, and alumina.

Since the quantum device 6a includes the spacer SP, it is possible to improve the stability of the mounted quantum chip 10 and thereby to improve the accuracy of the position thereof. Further, the thermal connection with the sample stage 30 can be improved. Further, it is possible to make full use of the mounting surface 21 by forming the interposer wiring layer 23 thereon.

Seventh Example Embodiment

Figure 26:
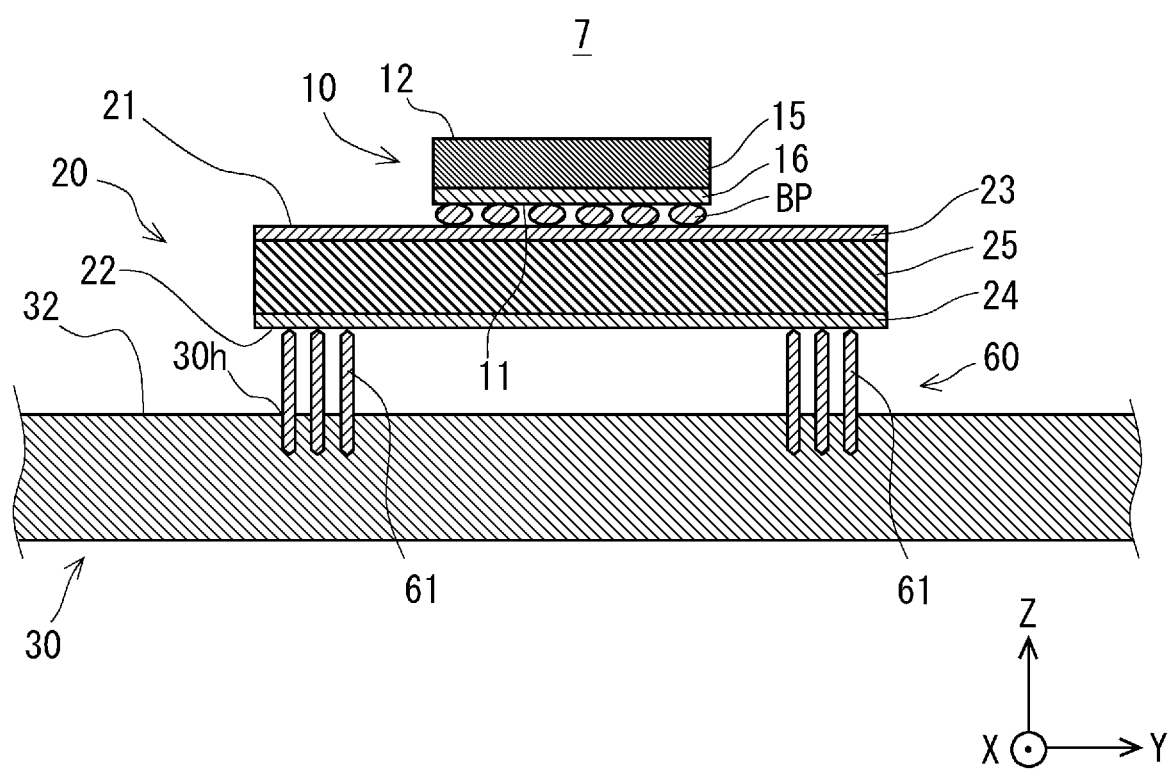
FIG. 26 is a cross-sectional view showing an example of a quantum device according to a seventh example embodiment.

Next, a seventh example embodiment will be described. In this example embodiment, movable pins 61 are in contact with the opposite surface 22 of the interposer 20. FIG. 26 is a cross-sectional view showing an example of a quantum device according to the seventh example embodiment. Note that, in FIG. 26, the direction perpendicular to the mounting surface 21 is defined as a Z-axis direction. Further, the mounting surface 21 side is defined as a Z-axis positive direction and the opposite surface 22 side is defined as a Z-axis negative direction. For the explanatory purpose, the Z-axis positive direction side is referred to as upward and the Z-axis negative direction side is referred to as downward. Therefore, in the quantum device 7 according to this example embodiment, the quantum chip 10 is disposed above (on the Z-axis positive direction side of) the interposer 20. In the above-described first to sixth example embodiments, the mounting surface 21 of the interposer 20 faces the sample stage 30. Therefore, they have been described on the assumption that, of the mounting surface 21 and the opposite surface 22, the first area AR11 and the second area AR12 are provided at least on the mounting surface 21 of the interposer 20. In contrast to this, in the quantum device 7 according to this example embodiment, the opposite surface 22 of the interposer 20 faces the sample stage 30 as shown in FIG. 26. Therefore, of the mounting surface 21 and the opposite surface 22, the first area AR21 and the second area AR22 are provided at least on the opposite surface 22. Accordingly, the movable member 60 is in contact with the second area AR22 of the opposite surface 22.

The quantum device 7 according to this example embodiment may include, in addition to the above-described configuration in which the movable pins 61 are in contact with the opposite surface 22 of the interposer 20, some of the configurations according to the above-described example embodiments and the modified examples. For example, the movable pins 60 of the movable member 61 may be inserted into the holes 20h or may be connected with the interposer 20 with the flat-plate part 62 interposed therebetween. Further, the interposer 20 may include thermal vias 27 and a connection member 28. In this example embodiment, it is also possible to improve the cooling function while securing the number of terminals. The rest of the configuration and the advantageous effects have been already described in the descriptions of the first to sixth example embodiments.

Although the present disclosure is described above with reference to example embodiments, the present disclosure is not limited to the above-described example embodiments and various modifications can be made within the scope and spirit of the present disclosure. For example, a combination of any two or more of the configurations of the first to seventh example embodiments, and a configuration in which a plurality of quantum chips 10 are connected to one interposer 20 are also included in the scope of the technical idea according to the example embodiments.

The whole or part of the example embodiments disclosed above can be described as, but not limited to, the following supplementary notes.

(Supplementary Note 1)

A quantum device comprising:
a quantum chip; and
an interposer on which the quantum chip is mounted, wherein
the interposer comprises a conductive wiring line electrically connected to the quantum chip,
a mounting surface of the interposer on which the quantum chip is mounted or an opposite surface opposite to the mounting surface includes a first area and a second area different from the first area as viewed in a direction perpendicular to the mounting surface or the opposite surface,
the conductive wiring line is disposed in the first area on the mounting surface or the opposite surface, and
a movable member is in contact with the second area of the interposer, the movable member comprising a movable pin movable relative to a sample stage having a cooling function so as to protrude from the sample stage.

(Supplementary Note 2)

The quantum device described in Supplementary note 1, wherein
the interposer includes a hole formed in the second area, and
the movable pin is in contact with an inner surface of the hole.

(Supplementary Note 3)

The quantum device described in Supplementary note 2, wherein the hole extends from the mounting surface to the opposite surface.

(Supplementary Note 4)

The quantum device described in Supplementary note 1, wherein
the movable member includes the movable pin and a flat-plate part having a planar shape, and
the movable pin is connected with the interposer with the flat-plate part interposed therebetween.

(Supplementary Note 5)

The quantum device described in any one of Supplementary notes 1 to 4, wherein
the quantum chip comprises a first surface and a second surface opposite to the first surface, the first surface being a surface that is opposed to the interposer when the quantum chip is mounted on the interposer, and
at least a part of the second surface is in contact with the sample stage.

(Supplementary Note 6)

The quantum device described in any one of Supplementary notes 1 to 4, wherein
the quantum chip comprises a first surface and a second surface opposite to the first surface, the first surface being a surface that is opposed to the interposer when the quantum chip is mounted on the interposer, and at least a part of the second surface is bonded or joined to the sample stage.

(Supplementary Note 7)

The quantum device described in any one of Supplementary notes 1 to 4, wherein the quantum chip comprises a first surface and a second surface opposite to the first surface, the first surface being a surface that is opposed to the interposer when the quantum chip is mounted on the interposer, and the second surface is disposed in such a manner that a space is formed between the second surface and the sample stage.

(Supplementary Note 8)

The quantum device described in any one of Supplementary notes 1 to 7, wherein the quantum chip comprises a quantum circuit in which a resonator is formed, the resonator comprising a loop circuit in which pieces of a superconducting material are connected to each other by a Josephson junction, a recess is formed in the sample stage, and an area in which the quantum circuit is formed is contained in an area of the recess as viewed in a direction perpendicular to the first surface of the quantum chip, the first surface being the surface that is opposed to the interposer when the quantum chip is mounted on the interposer.

(Supplementary Note 9)

The quantum device described in Supplementary note 8, wherein the quantum chip is in contact with a pillar extending from a bottom of the recess in a direction perpendicular to the first surface.

(Supplementary Note 10)

The quantum device described in any one of Supplementary notes 1 to 7, wherein the quantum chip comprises a quantum circuit in which a resonator is formed, the resonator comprising a loop circuit in which pieces of a superconducting material are connected to each other by a Josephson junction, a through hole is formed in the sample stage, and an area in which the quantum circuit is formed is contained in an area of the through hole as viewed in a direction perpendicular to the first surface of the quantum chip, the first surface being the surface that is opposed to the interposer when the quantum chip is mounted on the interposer.

(Supplementary Note 11)

The quantum device described in any one of Supplementary notes 1 to 4, wherein the quantum chip includes a first surface and a second surface opposite to the first surface, the first surface being a surface that is opposed to the interposer when the quantum chip is mounted on the interposer, and the movable member is movable relative to the sample stage so as to protrude from the sample stage, and includes a chip pin that is in contact with the second surface.

(Supplementary Note 12)

The quantum device described in any one of Supplementary notes 1 to 11, wherein the interposer includes a mounting surface on which the quantum chip is mounted, and a surface opposite to the mounting surface, and the opposite surface is in contact with a cooling member having a cooling function.

(Supplementary Note 13)

The quantum device described in any one of Supplementary notes 1 to 12, wherein the interposer includes a mounting surface on which the quantum chip is mounted, and a surface opposite to the mounting surface, and the interposer comprises an interposer substrate, and a thermal via extending from a mounting surface side of the interposer substrate to an opposite surface side thereof.

(Supplementary Note 14)

The quantum device described in Supplementary note 13, wherein the thermal via comprises a tapered part in which a diameter on the opposite surface side is larger than that on the mounting surface side.

(Supplementary Note 15)

The quantum device described in Supplementary note 13 or 14, wherein the interposer further comprises a common connection member configured to connect a plurality of thermal vias to each other.

(Supplementary Note 16)

The quantum device described in any one of Supplementary notes 1 to 15, wherein the quantum chip is disposed inside a recessed part formed in the sample stage, and a part of the interposer is in contact with the sample stage.

(Supplementary Note 17)

The quantum device described in Supplementary note 16, wherein the recessed part is formed in a predetermined surface of the sample stage, and a part of a mounting surface of the interposer on which the quantum chip is mounted is in contact with the predetermined surface.

(Supplementary Note 18)

The quantum device described in Supplementary note 17, wherein at least a part of a side surface of the interposer is in contact with a plurality of pressing members provided on the predetermined surface.

(Supplementary Note 19)

The described in Supplementary note 18, wherein the interposer has a rectangular shape as viewed in a direction perpendicular to the mounting surface, and flat-surface parts of the plurality of pressing members press parts of side surfaces of the interposer near respective corners thereof.

(Supplementary Note 20)

The quantum device described in Supplementary note 16, wherein the recessed part is formed in a predetermined surface of the sample stage, and at least a part of a side surface of the interposer is in contact with an inner surface of the recessed part.

(Supplementary Note 21)

The quantum device described in Supplementary note 16, wherein the recessed part is formed in a predetermined surface of the sample stage, a stepped surface comprising a step with respect to the predetermined surface is formed around a mouth of the recessed part, and at least a part of the mounting surface of the interposer on which the quantum chip is mounted is in contact with the stepped surface.

(Supplementary Note 22)

The quantum device described in Supplementary note 16, wherein the recessed part is formed in a predetermined surface of the sample stage, a stepped surface comprising a step with respect to the predetermined surface is formed around a mouth of the recessed part, and at least a part of a side surface of the interposer is in contact with a side surface located between the stepped surface and the predetermined surface.

(Supplementary Note 23)

The quantum device described in Supplementary note 22, wherein a part of a mounting surface of the interposer on which the quantum chip is mounted is disposed in such a manner that a space is formed between the part of the mounting surface and the stepped surface.

(Supplementary Note 24)

The quantum device described in Supplementary note 22, wherein a part of a mounting surface of the interposer on which the quantum chip is mounted is disposed in such a manner that a spacer is interposed between the part of the mounting surface and the stepped surface.

(Supplementary Note 25)

The quantum device described in any one of Supplementary notes 1 to 24, wherein the first and second areas are provided on the mounting surface.

(Supplementary Note 26)

The quantum device described in any one of Supplementary notes 1 to 4 and 13 to 15, wherein the first and second areas are provided on the opposite surface.

(Supplementary Note 27)

A quantum device comprising:
a quantum chip; and
an interposer on which the quantum chip is mounted, wherein
a movable pin movable relative to a sample stage having a cooling function is connected with the interposer with a flat-plate part having a planar shape interposed therebetween so as to protrude from the sample stage.

According to the present disclosure, it is possible to provide a quantum device capable of improving a cooling effect while securing the number of terminals.

The first to seventh embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

What is claimed is:

1. A quantum device comprising:
a quantum chip;
an interposer on which the quantum chip is mounted;
a sample stage having a cooling function; and
a movable member, wherein
the interposer comprises a conductive wiring line electrically connected to the quantum chip,
the interposer has a mounting surface on which the quantum chip is mounted and wherein the mounting surface of the interposer or an opposite surface opposite to the mounting surface includes a first area and a second area different from the first area as viewed in a direction perpendicular to the mounting surface or the opposite surface,
the conductive wiring line is disposed in the first area on the mounting surface or the opposite surface,
the movable member is in contact with the second area of the interposer, the movable member comprising a plurality of movable pins movable relative to the sample stage so as to protrude from the sample stage, and
the sample stage is a cold stage configured to be cooled by a refrigerator.

2. The quantum device according to claim 1, wherein
the interposer includes a plurality of holes formed in the second area, and
the each movable pin of the plurality of movable pins is in contact with an inner surface of each of the holes of the plurality of holes.

3. The quantum device according to claim 2, wherein the each hole of the plurality of holes extends from the mounting surface to the opposite surface.

4. The quantum device according to claim 1, wherein
the movable member includes the each movable pin of the plurality of movable pins and a flat-plate part having a planar shape, and
each of the movable pins is connected with the interposer with the flat-plate part interposed therebetween.

5. The quantum device according to claim 1, wherein
the quantum chip comprises a first surface and a second surface opposite to the first surface, the first surface being a surface that is opposed to the interposer when the quantum chip is mounted on the interposer, and
at least a part of the second surface is in contact with the sample stage.

6. The quantum device according to claim 1, wherein
the quantum chip comprises a first surface and a second surface opposite to the first surface, the first surface being a surface that is opposed to the interposer when the quantum chip is mounted on the interposer, and
at least a part of the second surface is bonded or joined to the sample stage.

7. The quantum device according to claim 1, wherein
the quantum chip comprises a first surface and a second surface opposite to the first surface, the first surface being a surface that is opposed to the interposer when the quantum chip is mounted on the interposer, and
the second surface is disposed in such a manner that a space is formed between the second surface and the sample stage.

8. The quantum device according to claim 1, wherein
the quantum chip comprises a quantum circuit in which a resonator is formed, the resonator comprising a loop circuit in which pieces of a superconducting material are connected to each other by a Josephson junction,
a recess is formed in the sample stage, and
an area in which the quantum circuit is formed is contained in an area of the recess as viewed in a direction perpendicular to the first surface of the quantum chip, the first surface being the surface that is opposed to the interposer when the quantum chip is mounted on the interposer.

9. The quantum device according to claim 8, wherein a pillar extending from a bottom of the recess in a direction perpendicular to the first surface is in contact with the quantum chip.

10. The quantum device according to claim 1, wherein
the quantum chip comprises a quantum circuit in which a resonator is formed, the resonator comprising a loop circuit in which pieces of a superconducting material are connected to each other by a Josephson junction,
a through hole is formed in the sample stage, and
an area in which the quantum circuit is formed is contained in an area of the through hole as viewed in a direction perpendicular to the first surface of the quantum chip, the first surface being the surface that is opposed to the interposer when the quantum chip is mounted on the interposer.

11. The quantum device according to claim 1, wherein
the quantum chip includes a first surface and a second surface opposite to the first surface, the first surface being a surface that is opposed to the interposer when the quantum chip is mounted on the interposer, and
the movable member is movable relative to the sample stage so as to protrude from the sample stage, and includes a chip pin that is in contact with the second surface.

12. The quantum device according to claim 1, wherein
the interposer includes a mounting surface on which the quantum chip is mounted, and a surface opposite to the mounting surface, and
a cooling member having the cooling function is in contact with the opposite surface.

13. The quantum device according to claim 1, wherein
the interposer includes a mounting surface on which the quantum chip is mounted, and a surface opposite to the mounting surface, and
the interposer comprises an interposer substrate, and a thermal via extending from a mounting surface side of the interposer substrate to an opposite surface side thereof.

14. The quantum device according to claim 13, wherein the thermal via comprises a tapered part in which a diameter on the opposite surface side is larger than that on the mounting surface side.

15. The quantum device according to claim 13, wherein the interposer further comprises a common connection member configured to connect a plurality of thermal vias to each other.

16. The quantum device according to claim 1, wherein
the quantum chip is disposed inside a recessed part formed in the sample stage, and
a part of the interposer is in contact with the sample stage.

17. The quantum device according to claim 16, wherein
the recessed part is formed in a predetermined surface of the sample stage, and
a part of a mounting surface of the interposer on which the quantum chip is mounted is in contact with the predetermined surface.

18. The quantum device according to claim 17, wherein at least a part of a side surface of the interposer is in contact with a plurality of pressing members provided on the predetermined surface.

19. The quantum device according to claim 18, wherein
the interposer has a rectangular shape as viewed in a direction perpendicular to the mounting surface, and
flat-surface parts of the plurality of pressing members press parts of side surfaces of the interposer near respective corners thereof.

20. A quantum device comprising:
a quantum chip;
an interposer on which the quantum chip is mounted;
a sample stage having a cooling function; and
a movable member, wherein
a plurality of movable pins movable relative to the sample stage is connected with the interposer with a flat-plate part having a planar shape interposed therebetween so as to protrude from the sample stage, and
the sample stage is a cold stage configured to be cooled by a refrigerator.

* * * * *